(12) United States Patent
Jang

(10) Patent No.: US 11,948,919 B2
(45) Date of Patent: Apr. 2, 2024

(54) STACKED SEMICONDUCTOR PACKAGE

(71) Applicant: SAMSUNG ELECTRONICS CO., LTD., Suwon-si (KR)

(72) Inventor: Ae-Nee Jang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 165 days.

(21) Appl. No.: 17/454,114

(22) Filed: Nov. 9, 2021

(65) Prior Publication Data

US 2022/0208730 A1 Jun. 30, 2022

(30) Foreign Application Priority Data

Dec. 31, 2020 (KR) .................. 10-2020-0188715

(51) Int. Cl.
*H01L 25/065* (2023.01)
*H01L 23/00* (2006.01)
*H01L 23/48* (2006.01)

(52) U.S. Cl.
CPC ........ *H01L 25/0657* (2013.01); *H01L 23/481* (2013.01); *H01L 24/08* (2013.01); *H01L 24/32* (2013.01); *H01L 24/48* (2013.01); *H01L 24/49* (2013.01); *H01L 24/73* (2013.01); *H01L 25/0652* (2013.01); *H01L 2224/08146* (2013.01); *H01L 2224/32145* (2013.01); *H01L 2224/48091* (2013.01); *H01L 2224/48145* (2013.01); *H01L 2224/48227* (2013.01); *H01L 2224/73265* (2013.01); *H01L 2225/06562* (2013.01)

(58) Field of Classification Search
CPC ............ H01L 25/0652; H01L 25/0657; H01L 23/481; H01L 24/08; H01L 24/32; H01L 24/48; H01L 24/49; H01L 24/73; H10B 80/00
USPC .................................. 257/686, 777
See application file for complete search history.

(56) References Cited

U.S. PATENT DOCUMENTS

| | | |
|---|---|---|
| 8,093,726 B2 | 1/2012 | Park |
| 9,208,827 B2 | 12/2015 | Lee et al. |
| 9,449,853 B2 | 9/2016 | Kim et al. |
| 10,283,178 B2 | 5/2019 | Takahashi |

(Continued)

FOREIGN PATENT DOCUMENTS

| | | |
|---|---|---|
| KR | 20100134354 | 12/2010 |
| KR | 101413220 | 6/2014 |
| KR | 102026979 | 9/2019 |

*Primary Examiner* — Jasmine J Clark
(74) *Attorney, Agent, or Firm* — F. CHAU & ASSOCIATES, LLC

(57) ABSTRACT

A semiconductor package includes a plurality of first semiconductor structures that are stacked on a package substrate and are offset from each other in a first direction, and a plurality of first adhesive layers disposed between the first semiconductor structures. Each of the first semiconductor structures includes a first sub-chip and a second sub-chip in contact with a part of a top surface of the first sub-chip. The first adhesive layers are disposed between and are in contact with the first sub-chips. The first adhesive layers are spaced apart from the second sub-chips. A thickness of each of the first adhesive layers is less than a thickness of each of the second sub-chips. The thickness of the second sub-chip is in a range of about 13 μm to about 20 μm.

20 Claims, 21 Drawing Sheets

(56) References Cited

U.S. PATENT DOCUMENTS

| | | |
|---|---|---|
| 10,483,236 B2 | 11/2019 | Iwamoto |
| 2010/0314740 A1 | 12/2010 | Choi et al. |
| 2012/0051113 A1 | 3/2012 | Choi et al. |
| 2017/0028098 A1 | 2/2017 | Pearce et al. |
| 2017/0167284 A1 | 6/2017 | Pearce et al. |
| 2018/0122771 A1* | 5/2018 | Park .................... H01L 25/0652 |
| 2020/0150894 A1 | 5/2020 | Lee et al. |
| 2020/0185388 A1 | 6/2020 | Lu |
| 2020/0203330 A1 | 6/2020 | Delacruz et al. |
| 2020/0286860 A1* | 9/2020 | Lee ........................ H01L 24/48 |

\* cited by examiner

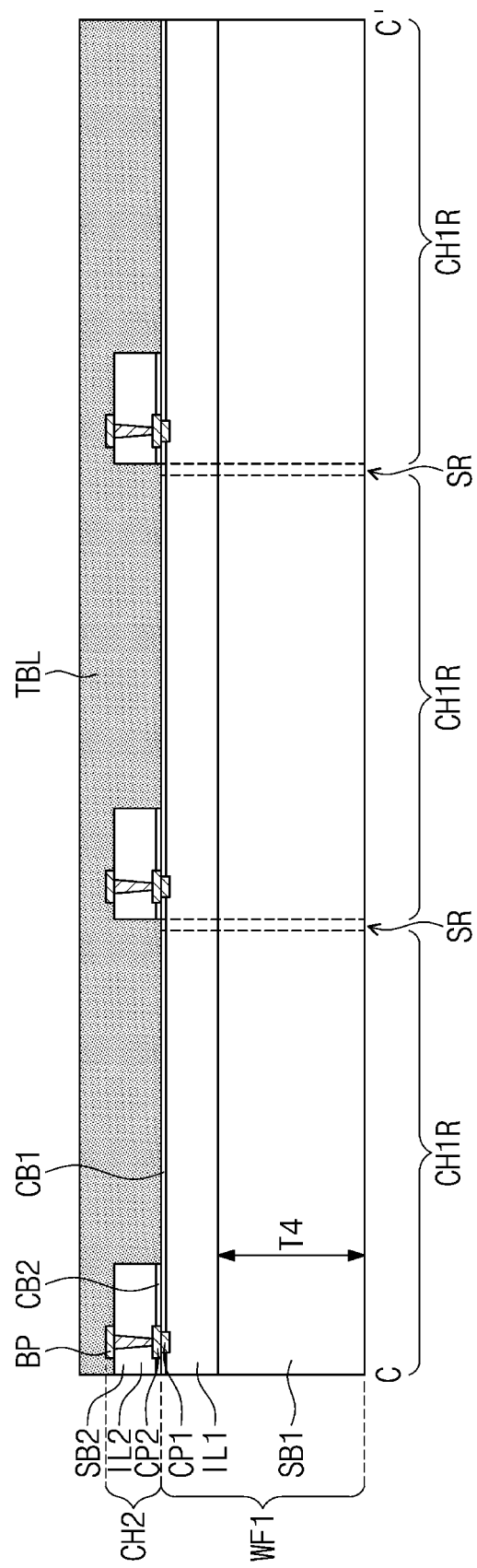

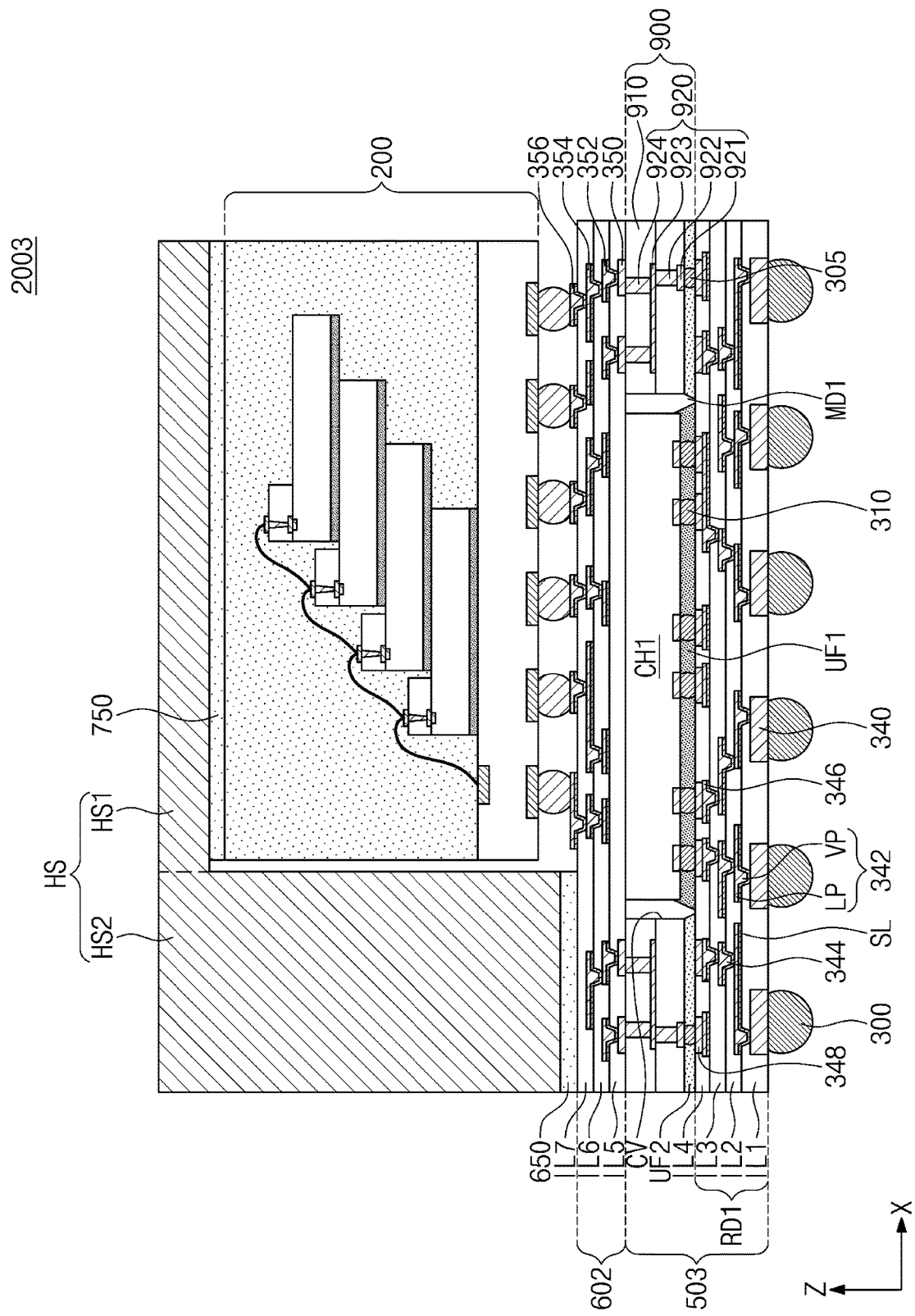

STACKED SEMICONDUCTOR PACKAGE

CROSS-REFERENCE TO RELATED APPLICATION

This U.S. nonprovisional application claims priority under 35 U.S.C § 119 to Korean Patent Application No. 10-2020-0188715, filed on Dec. 31, 2020 in the Korean Intellectual Property Office, the disclosure of which is hereby incorporated by reference in its entirety.

TECHNICAL FIELD

The present inventive concepts relate to semiconductors and, more specifically, to a stacked semiconductor package.

DISCUSSION OF THE RELATED ART

Semiconductor chips are generally disposed within a semiconductor package to protect the chips and to facilitate their incorporation into electronic products. A semiconductor package is typically configured such that a semiconductor chip is mounted on a printed circuit board (PCB) and bonding wires or bumps are used to electrically connect the packaged semiconductor chip to the printed circuit board.

SUMMARY

A semiconductor package includes a plurality of first semiconductor structures that are stacked on a package substrate and are offset from each other in a first direction and a plurality of first adhesive layers disposed between the first semiconductor structures. Each of the first semiconductor structures includes a first sub-chip and a second sub-chip in contact with a part of a top surface of the first sub-chip. The first adhesive layers are disposed between and are in contact with the first sub-chips. The first adhesive layers are spaced apart from the second sub-chips. A thickness of each of the first adhesive layers is less than a thickness of each of the second sub-chips. The thickness of the second sub-chip is within a range of about 13 μm to about 20 μm.

A semiconductor package includes a plurality of first semiconductor structures that are stacked on a package substrate and are offset from each other in a first direction and a plurality of first adhesive layers disposed between the first semiconductor structures. Each of the first semiconductor structures includes a first memory chip and a first peripheral circuit chip in contact with a part of a top surface of the first memory chip. The first adhesive layers are disposed between and are in contact with the first memory chips. The first adhesive layers are spaced apart from the first peripheral circuit chips. The first memory chip includes a first semiconductor substrate that includes a cell array region and a connection region, a plurality of electrode layers and a plurality of inter-electrode dielectric layers that are alternately stacked on the first semiconductor substrate and form a stepwise shape on the connection region, a plurality of vertical patterns disposed on the cell array region, the vertical patterns penetrating the electrode layers and the inter-electrode dielectric layers, a planarized dielectric layer disposed on the connection region, the planarized dielectric layer covering ends of the electrode layers and ends of the inter-electrode dielectric layers, and a plurality of cell contacts disposed on the connection region, the cell contacts penetrating the planarized dielectric layer and the inter-electrode dielectric layers to come into contact with corresponding electrode layers. The first peripheral circuit chip overlaps the cell contacts and does not overlap at least one of the vertical patterns.

A semiconductor package includes a first semiconductor structure and a second semiconductor structure that are sequentially stacked on a package substrate. The second semiconductor structure is stacked on the first semiconductor package with a portion of the first semiconductor structure being exposed by the second semiconductor structure. The first semiconductor structure includes a first memory chip and a first peripheral circuit chip in contact with a part of a top surface of the first memory chip. The first peripheral circuit chip is electrically connected to the first memory chip. The second semiconductor structure includes a second memory chip and a second peripheral circuit chip in contact with a part of a top surface of the second memory chip. The second peripheral circuit chip is electrically connected to the second memory chip. The second memory chip overlaps the first memory chip and does not overlap the first peripheral circuit chip.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIGS. 8A to 8E are cross-sectional views showing a method of fabricating the semiconductor package of FIG. 2;

FIG. 15 is a cross-sectional view showing a semiconductor package according to some embodiments of the present inventive concepts.

DETAILED DESCRIPTION OF THE DRAWINGS

Figure 1:
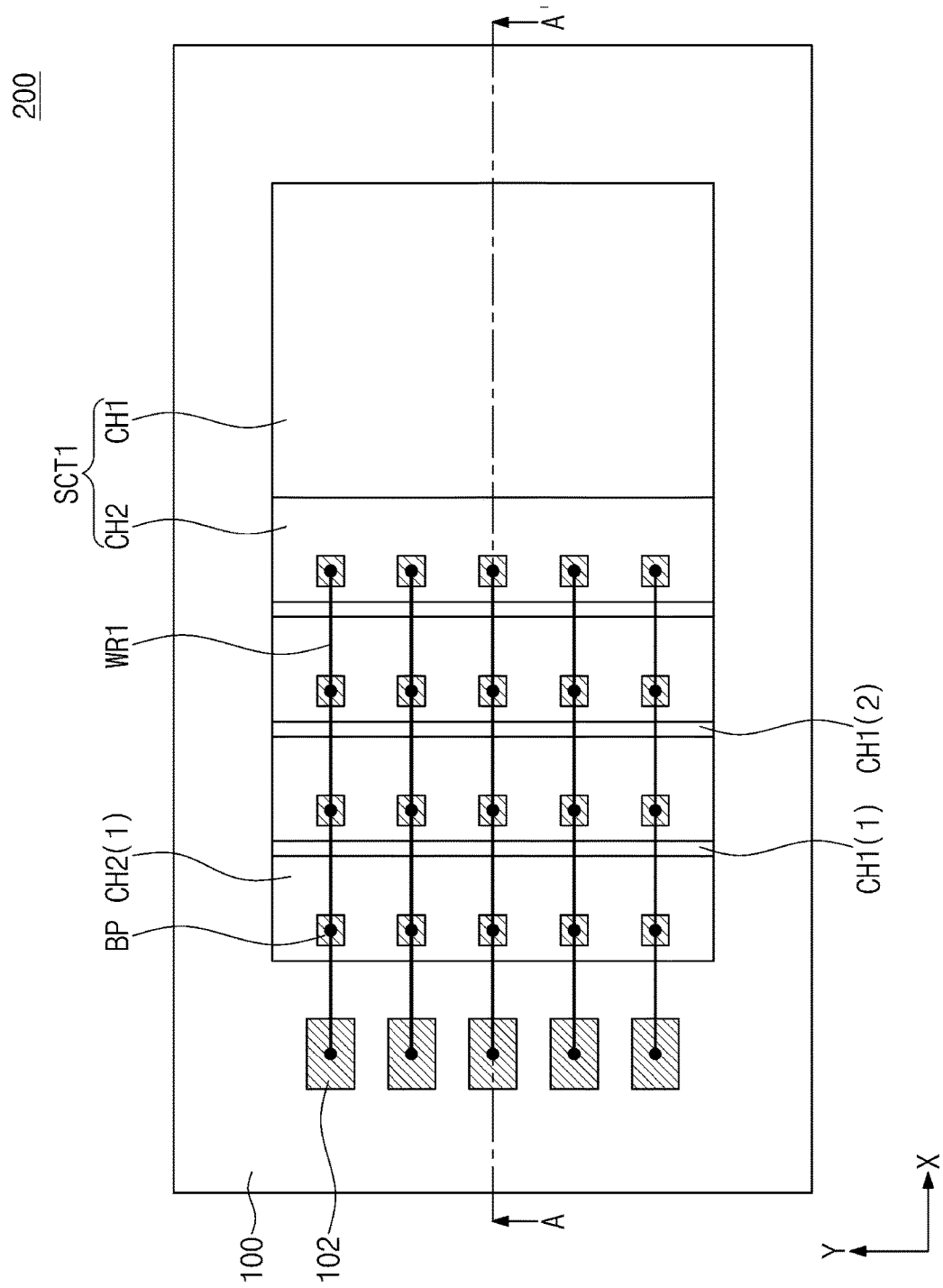
FIG. 1 is a plan view showing a semiconductor package according to some embodiments of the present inventive concepts.
Figure 2:
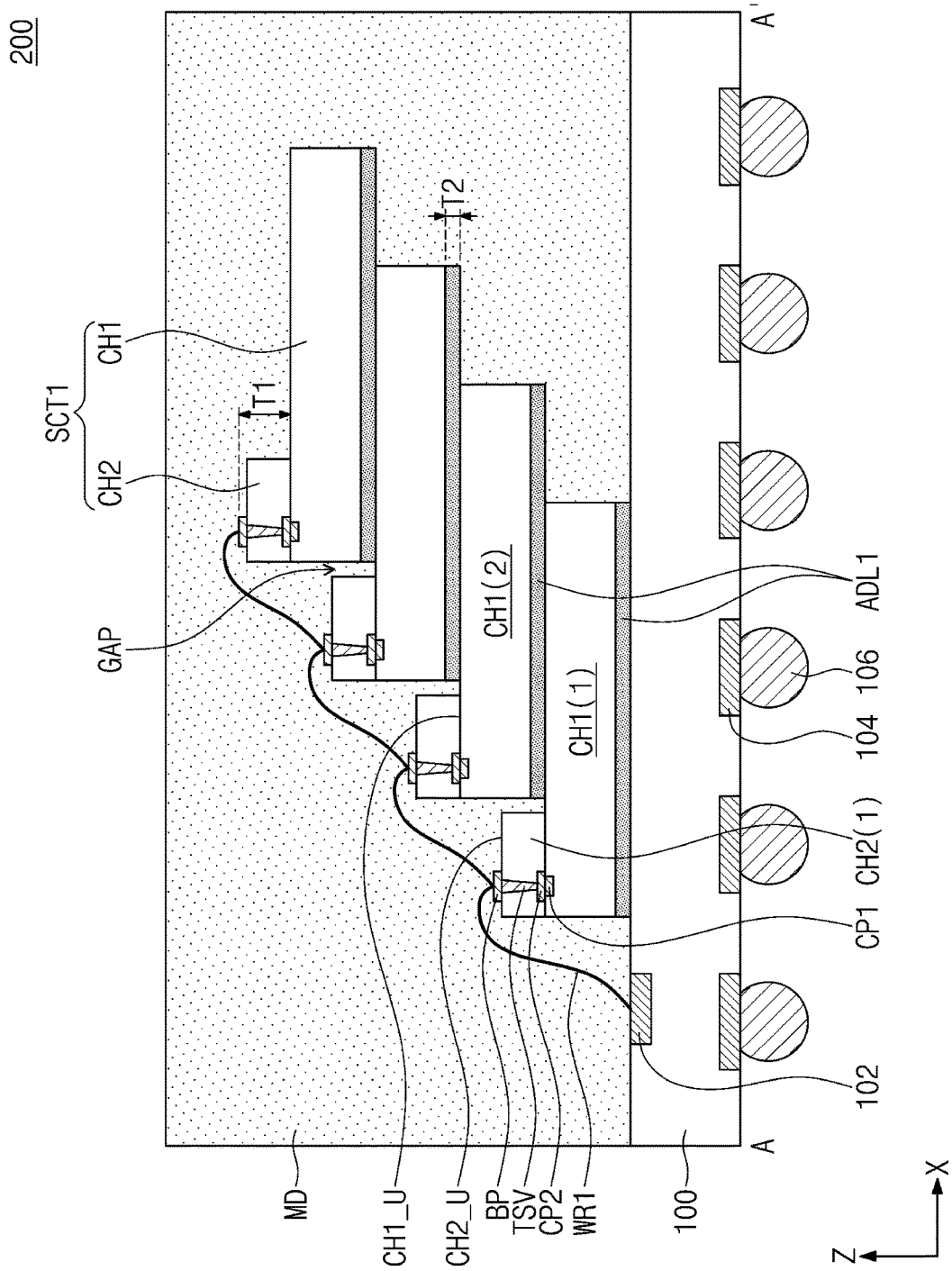
FIG. 2 is a cross-sectional view taken along line A-A' of FIG. 1.

A more complete appreciation of the present disclosure and many of the attendant aspects thereof will be readily obtained as the same becomes better understood by reference to the following detailed description when considered in connection with the accompanying drawings, wherein:

FIG. 1 is a plan view showing a semiconductor package according to some embodiments of the present inventive concepts. FIG. 2 is a cross-sectional view taken along line A-A' of FIG. 1.

Referring to FIGS. 1 and 2, a semiconductor package 200 may include first semiconductor structures SCT1 stacked on a package substrate 100. The package substrate 100 may be, for example, a double-sided or multi-layered printed circuit board. The package substrate 100 may include upper conductive pads 102 disposed on a top surface of the package substrate 100 and ball lands 104 disposed on a bottom surface of the package substrate 100. External connection terminals 106 may be bonded to the ball lands 104, for example, on a one-to-one basis. The external connection terminals 106 may include conductive bumps, conductive pillars, and/or solder balls.

The package substrate 100 may have therein internal lines that connect the upper conductive pads 102 to the ball lands 104. The package substrate 100 may be replaced with a semiconductor chip.

The first semiconductor structures SCT1 may be offset from each other in a first direction X to form a stepwise shape. As used herein, the term "offset" means that proximate first semiconductor structures partially overlap and partially overhang each other. First adhesive layers ADL1 may be interposed between pairs of adjacent first semiconductor structures SCT1. One of the first adhesive layers ADL1 may be interposed between the package substrate 100 and a lowermost one of the first semiconductor structures SCT1.

Each of the first semiconductor structures SCT1 may include a first sub-chip CH1 and a second sub-chip CH2. The second sub-chip CH2 may be disposed on a portion of the first semiconductor structure SCT1 that is not overlapped by the first semiconductor structure SCT1 that is immediately above. The second sub-chip CH2 may contact a portion of a top surface CH1_U of the first sub-chip CH1 and may expose a remainder of the top surface CH1_U of the first sub-chip CH1. The second sub-chip CH2 may have a bar shape that extends in a second direction Y along one sidewall of the first sub-chip CH1, and the second direction Y may horizontally intersect the first direction X. The second sub-chip CH2 may have an "I" shape (or dumbbell shape) in a plan view.

The first sub-chip CH1 may be electrically connected to the second sub-chip CH2. The first sub-chip CH1 may include a first connection pad CP1 in contact with the second sub-chip CH2. The second sub-chip CH2 may include a second connection pad CP2 in contact with the first connection pad CP1. The second sub-chip CH2 may further include a through via TSV connected to the second connection pad CP2 and a bonding pad BP in contact with the through via TSV. A first wire WR1 may contact the upper conductive pad 102, while linearly connecting the bonding pads BP of the first semiconductor structures SCT1.

The first adhesive layer ADL1 may be interposed between and in contact with neighboring first sub-chips CH1. The first adhesive layer ADL1 may be spaced apart from the second sub-chips CH2.

It is shown that the first adhesive layer ADL1 extends across the entire bottom surface of the second sub-chip CH2, including the overhang portion that is not in contact with a lower second sub-chip CH2. However, the present inventive concepts may alternatively limit the disposition of the first adhesive layer ADL1 to the overlapped area where an upper second sub-chip CH2 overlaps a lower second sub-chip CH2.

The second sub-chip CH2 may have a first thickness T1. The first adhesive layer ADL1 may have a second thickness T2. The second thickness T2 may be less than or equal to the first thickness T1. A top surface CH2_U of the second sub-chip CH2 included in one of the first semiconductor structures SCT1 may be lower than the top surface CH1_U of the first sub-chip CH1 included in the first semiconductor structure SCT1 that immediately overlies the one of the first semiconductor structures SCT1. For example, the top surface CH2_U of the second sub-chip CH2(1) included in the lowermost first semiconductor structure SCT1 may be lower than the top surface CH1_U of the first sub-chip CH1(2) included in the first semiconductor structure SCT1, or second-from-bottom of the first semiconductor structures SCT1.

The first sub-chip CH1 and the second sub-chip CH2 may be electrically connected to each other, and may have different functions from each other. For example, the first sub-chip CH1 may be a memory chip, and the second sub-chip CH2 may be a driver chip for the first sub-chip CH1. For example, the first semiconductor structure SCT1 may be a single memory chip, and the semiconductor package 200 may include a plurality of memory chips.

The first sub-chip CH1 may include a memory cell array whose area is larger than the second sub-chip CH2, and the second sub-chip CH2 may include one or more of core, peripheral circuit, and logic regions whose area is smaller than the first sub-chip CH1. The first sub-chip CH1 may include a memory cell array of VNAND, NAND, DRAM, SRAM, PRAM, MRAM, EEPROM, and/or ReRAM, and the second sub-chip CH2 may include a decoder circuit, page buffer circuit, word-line driver circuit, sensing amplifier circuit, and/or logic circuit for performing data write/read/erase operation on the memory cell array.

According to the present inventive concepts, one semiconductor chip may be divided based on function to form the first sub-chip CH1 and the second sub-chip CH2 having different sizes from each other, and the first and second sub-chips CH1 and CH2 may be stacked to form the first semiconductor structure SCT1, with the result that a semiconductor chip may decrease in horizontal size.

The second sub-chip CH2 whose size is larger than the first sub-chip CH1 may be stacked on the first sub-chip CH1 whose size is smaller than the second sub-chip CH2, and this stacking scheme may form the first semiconductor structure SCT1 having a stepped structure. For example, the first semiconductor structure SCT1 may have a stepped top surface. As shown in FIG. 2, when the stepped first semiconductor structures SCT1 may be stacked offset from each other to reduce an overall size of the semiconductor package 200.

The first semiconductor structures SCT1, the first wires WR1, and the package substrate 100 may all be covered with a mold layer MD. The mold layer MD may include a dielectric resin, such as epoxy molding compound (EMC). The mold layer MD may further include fillers dispersed in the dielectric resin. The second sub-chip CH2 of one of the first semiconductor structures SCT1 may be spaced apart from the first sub-chip CH1 of the first semiconductor structure SCT1 that immediately overlies the one of the first semiconductor structures SCT1, thereby forming a space GAP. The mold layer MD may fill the space GAP. For example, the space GAP or the mold layer MD filling the space GAP may be interposed between the lowermost second sub-chip CH2(1) and the first sub-chip CH1(2) that is the second-from-bottom chip.

Figure 3:
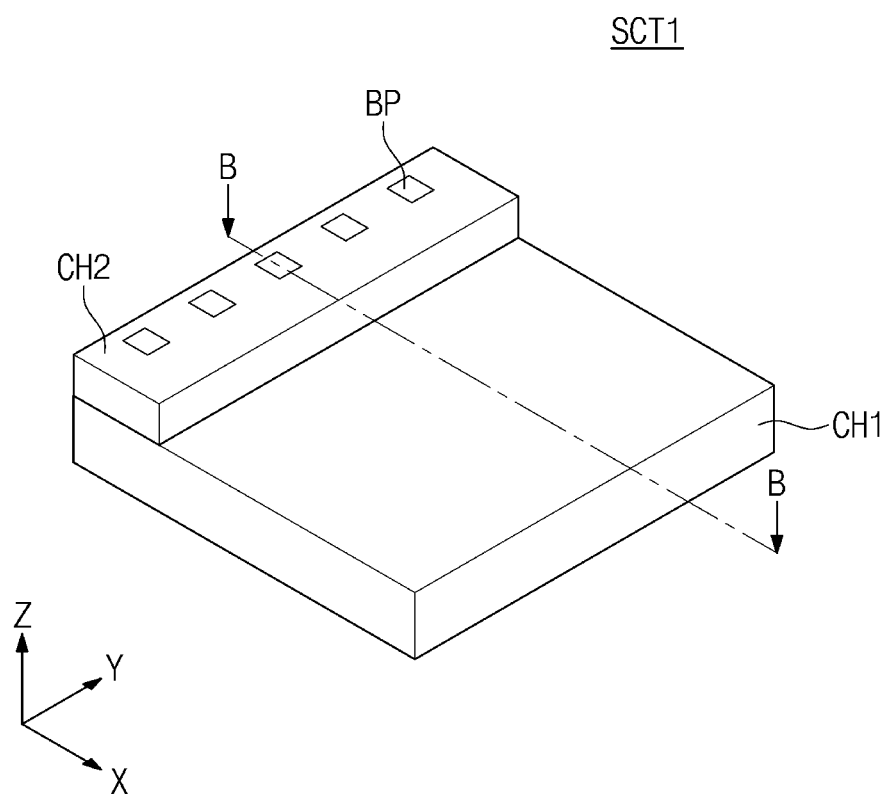
FIG. 3 is a perspective view showing a first semiconductor structure according to some embodiments of the present inventive concepts.
Figure 4:
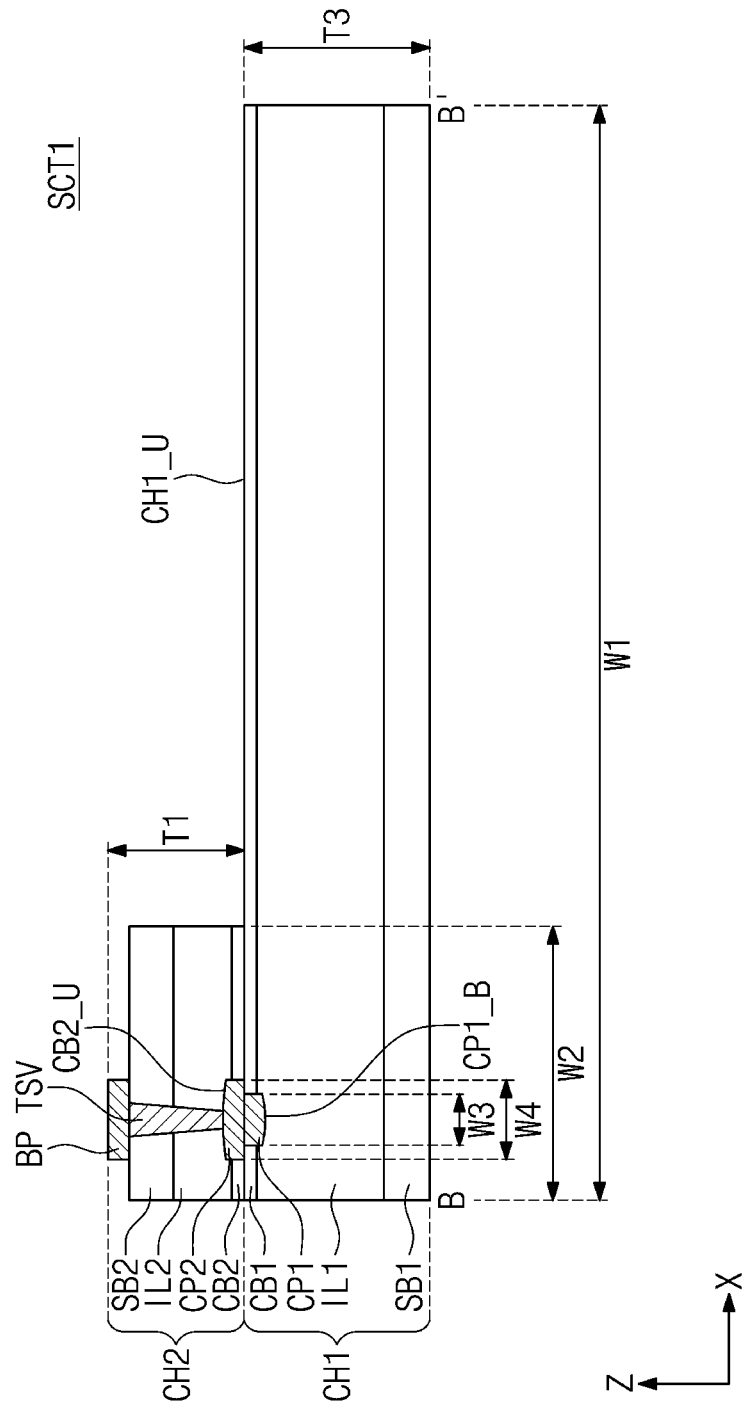
FIG. 4 is a cross-sectional view taken along line B-B' of FIG. 3.

FIG. 3 is a perspective view showing a first semiconductor structure according to some embodiments of the present inventive concepts. FIG. 4 is a cross-sectional view taken along line B-B' of FIG. 3.

Referring to FIGS. 3 and 4, the first semiconductor structure SCT1, according to an embodiment, may include a first sub-chip CH1 and a second sub-chip CH2. The first sub-chip CH1 may include a first semiconductor substrate SB1, and may also include a first interlayer dielectric layer IL1 and a first adhesive dielectric layer CB1 that are sequentially stacked on the first semiconductor substrate SB1. The first semiconductor substrate SB1 may be a single-crystalline silicon substrate, a silicon epitaxial layer, or a silicon-on-insulator (SOI) substrate. The first interlayer dielectric layer IL1 may have a single-layered or multi-layered structure formed from a silicon oxide layer, a silicon nitride layer, a silicon oxynitride layer, and/or a porous dielectric layer. The first adhesive dielectric layer CB1 may be formed from a silicon oxide layer, a silicon nitride layer, a silicon oxynitride layer, a silicon carbide layer, a silicon carbonitride layer, a metal oxide layer, and/or a metal nitride layer.

The first sub-chip CH1 may further include a first connection pad CP1. The first connection pad CP1 may include copper. The first connection pad CP1 may penetrate the first adhesive dielectric layer CB1 and may partially extend into the first interlayer dielectric layer IL1. The first connection pad CP1 may have a bottom surface CP1_B that is downwardly convexly rounded. The first semiconductor substrate SB1 may be provided with a plurality of transistor disposed thereon, a plurality of selection elements disposed thereon, and/or a memory cell array disposed thereon. In addition, the first interlayer dielectric layer IL1 may be provided with first wiring lines connected to the transistors disposed thereon, the selection elements disposed thereon, and/or the memory cell array disposed thereon. The first connection pad CP1 may be connected to at least one of the first wiring lines.

The second sub-chip CH2 may include a second semiconductor substrate SB2, and may also include a second interlayer dielectric layer IL2 and a second adhesive dielectric layer CB2 that are sequentially stacked on the second semiconductor substrate SB2. The second semiconductor substrate SB2 may be a single-crystalline silicon substrate, a silicon epitaxial layer, or a silicon-on-insulator (SOI) substrate. The second interlayer dielectric layer IL2 may have a single-layered or multi-layered structure formed from a silicon oxide layer, a silicon nitride layer, a silicon oxynitride layer, and/or a porous dielectric layer. The second adhesive dielectric layer CB2 may be formed from a silicon oxide layer, a silicon nitride layer, a silicon oxynitride layer, a silicon carbide layer, a silicon carbonitride layer, a metal oxide layer, and/or a metal nitride layer.

The second sub-chip CH2 may further include a second connection pad CP2. The second connection pad CP2 may include copper. The second connection pad CP2 may penetrate the second adhesive dielectric layer CB2 and may partially extend into the second interlayer dielectric layer IL2. A bonding process may be performed in such a way that the second sub-chip CH2 may be turned upside down and bonded to the first sub-chip CH1. Therefore, the first adhesive dielectric layer CB1 may contact the second adhesive dielectric layer CB2, and the first connection pad CP1 may contact the second connection pad CP2. The second connection pad CP2 may have a top surface CP2_U that is upwardly convexly rounded. An annealing or thermo-compression process may be adopted to perform the bonding process during which applied heat may expand copper that constitutes the first and second connection pads CP1 and CP2, and thus the bottom surface CP1_B of the first connection pad CP1 may roundly protrude toward the first adhesive dielectric layer CB1 and the top surface CP2_U of the second connection pad CP2 may roundly protrude upwards from the first adhesive dielectric layer CB1. The first sub-chip CH1 may be electrically connected to the second sub-chip CH2 through the first connection pad CP1 and the second connection pad CP2. When the bonding process is performed, the first and second connection pads CP1 and CP2 may be merged and may thus have no interface therebetween.

A plurality of transistors may be disposed on the second semiconductor substrate SB2. In addition, the second interlayer dielectric layer IL2 may be provided therein with second wiring lines connected to the transistors. The second connection pad CP2 may be connected to at least one of the second wiring lines.

The second sub-chip CH2 may further include a through via TSV that penetrates the second semiconductor substrate SB2 and at least a portion of the second interlayer dielectric layer IL2 and has electrical connection with the second connection pad CP2. The second semiconductor substrate SB2 may be provided thereon with a bonding pad BP in contact with the through via TSV. A dielectric layer may be interposed between the through via TSV and the second semiconductor substrate SB2. The through via TSV may include a metal, such as tungsten, copper, and/or aluminum. The bonding pad BP may include a metal, such as aluminum, nickel, tin, copper, and/or gold. The first sub-chip CH1 may be electrically connected to the outside through the bonding pad BP of the second sub-chip CH2.

The first sub-chip CH1 may have a first width W1 in the first direction X. The second sub-chip CH2 may have a second width W2 in the first direction X. The second width W2 may be about 1/20 to about 1/4 of the first width W1. A bottom surface of the second sub-chip CH2 may have an area about 1/20 to about 1/4 of that of the first sub-chip CH1. The first sub-chip CH1 may have a third thickness T3 that is less than a first thickness T1 of the second sub-chip CH2. Because the second sub-chip CH2 has a width smaller than that of the first sub-chip CH1, the first semiconductor structure SCT1 may have a stepped structure on a top surface thereof.

The first connection pad CP1 may have a third width W3. The second connection pad CP2 may have a fourth width W4. The third width W3 may be less than the fourth width W4. Because the fourth width W4 is larger than the third width W3, when the second sub-chip CH2 is bonded to the first sub-chip CH1, a margin for misalignment may be securely obtained to reduce process failure and to increase process yield.

Figure 5:
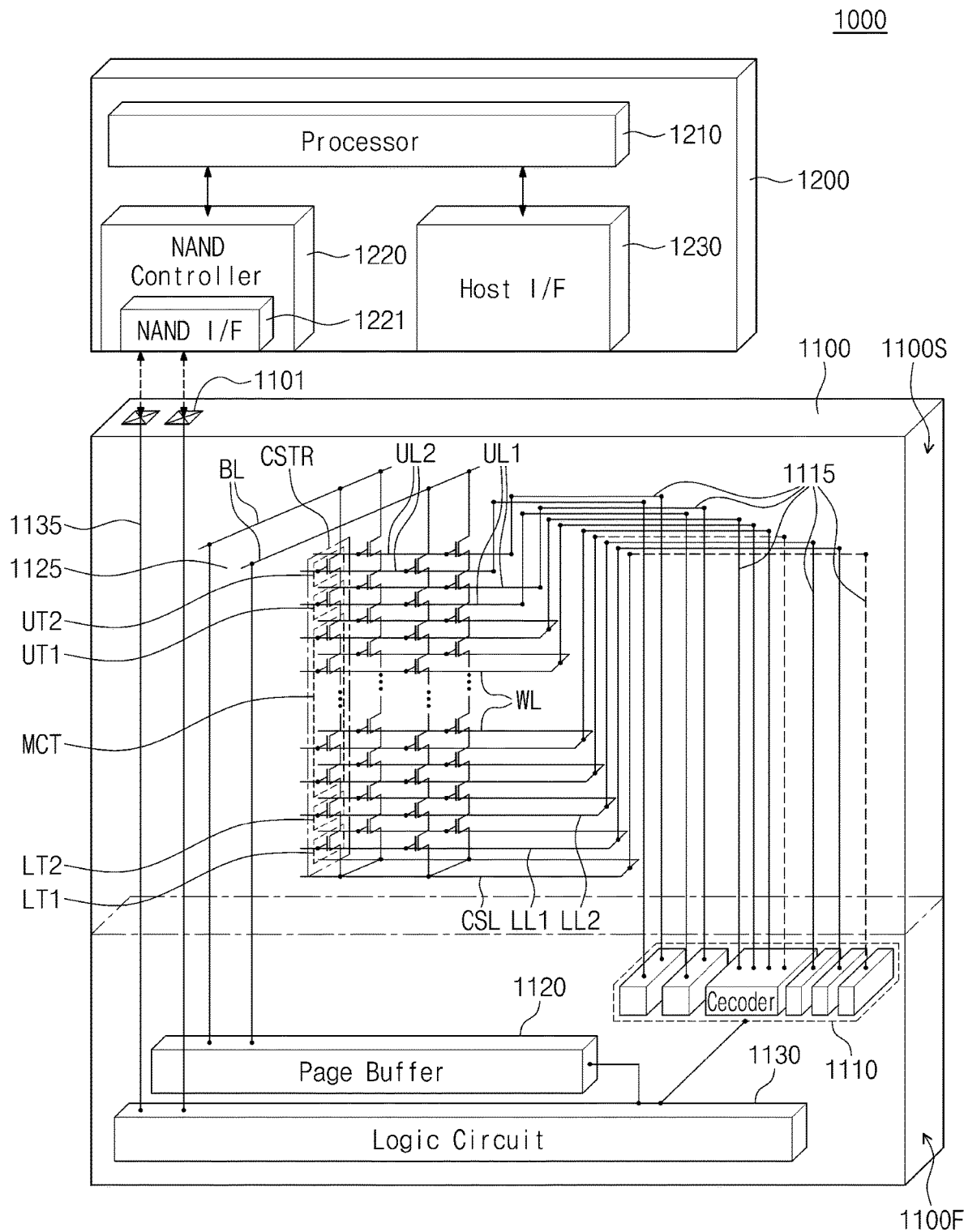
FIG. 5 is a simplified schematic diagram showing an electronic system of a semiconductor structure according to some embodiments of the present inventive concepts.
Figure 6:
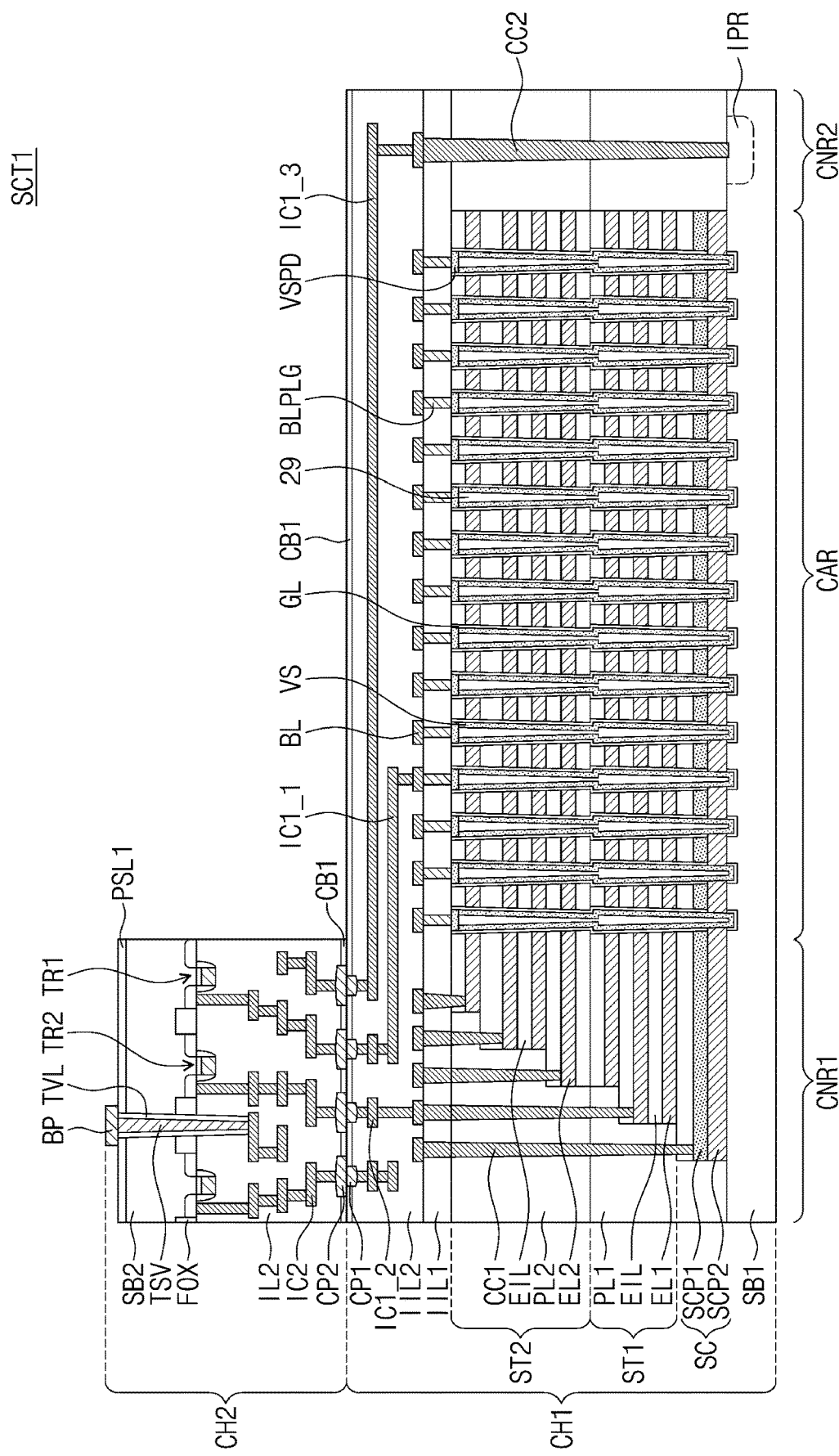
FIG. 6 is a cross-sectional view showing a semiconductor structure according to some embodiments of the present inventive concepts.

With reference to FIGS. 5 and 6, the following will describe an example in which the first semiconductor structure SCT1 is a vertical NAND chip.

FIG. 5 is a simplified schematic diagram showing an electronic system of a semiconductor structure according to some embodiments of the present inventive concepts.

Referring to FIG. 5, an electronic system 1000, according to some embodiments of the present inventive concepts, may include a semiconductor device 1100 and a controller 1200 electrically connected to the semiconductor device 1100. The electronic system 1000 may be a storage device that includes a single or a plurality of semiconductor devices 1100, or may be an electronic device that includes the storage device. For example, the electronic system 1000 may be a solid state drive (SSD) device, a universal serial bus (USB) device, a computing system, a medical apparatus, or a communication apparatus, each of which includes a single or a plurality of semiconductor devices 1100.

The semiconductor device 1100 may be a nonvolatile memory device, such as NAND Flash memory device. The semiconductor device 1100 may include a first structure 1100F and a second structure 1100S disposed on, or otherwise connected to, the first structure 1100F. In some embodiments, the first structure 1100F may be disposed on a side of the second structure 1100S. The first structure 1100F may be a peripheral circuit structure that includes a decoder circuit 1110, a page buffer 1120, and a logic circuit 1130. The second structure 1100S may be a memory cell structure that includes bit lines BL, a common source line CSL, word lines WL, first and second gate upper lines UL1 and UL2, first and second gate lower lines LL1 and LL2, and memory cell strings CSTR between the bit line BL and the common source line CSL.

On the second structure 1100S, each of the memory cell strings CSTR may include lower transistors LT1 and LT2 adjacent to the common source line CSL, upper transistors UT1 and UT2 adjacent to the bit line BL, and memory cell transistors MCT disposed between the lower transistors LT1 and LT2 and the upper transistors UT1 and UT2. The number of the lower transistors LT1 and LT2 and of the upper transistors UT1 and UT2 may be variously changed in accordance with embodiments.

In some embodiments, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In some embodiments, the lower transistors LT1 and LT2 may include a lower erasure control transistor LT1 and a ground selection transistor LT2 that are connected in series. The upper transistors UT1 and UT2 may include a string selection transistor UT1 and an upper erasure control transistor UT2 that are connected in series. One or both of the lower and upper erasure control transistors LT1 and UT1 may be employed to perform an erase operation in which a gate induced drain leakage (GIDL) phenomenon is used to erase data stored in the memory cell transistors MCT.

The common source line CSL, the first and second gate lower lines LL1 and LL2, the word lines WL, and the first and second gate upper lines UL1 and UL2 may be electrically connected to the decoder circuit 1110 through first connection lines 1115 that extend from the first structure 1100F toward the second structure 1100S. The bit lines BL may be electrically connected to the page buffer 1120 through second connection lines 1125 that extend from the first structure 1100F toward the second structure 1100S.

On the first structure 1100F, the decoder circuit 1110 and the page buffer 1120 may perform a control operation to at least one selection memory cell transistor among the plurality of memory cell transistors MCT. The logic circuit 1130 may control the decoder circuit 1110 and the page buffer 1120. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first structure 1100F toward the second structure 1100S.

The controller 1200 may include a processor 1210, a NAND controller 1220, and a host interface 1230. In some embodiments, the electronic system 1000 may include a plurality of semiconductor devices 1100, and in this case, the controller 1200 may control the plurality of semiconductor devices 1100.

The processor 1210 may control an overall operation of the electronic system 1000 including the controller 1200. The processor 1210 may operate based on predetermined firmware, and may control the NAND controller 1220 to access the semiconductor device 1100. The NAND controller 1220 may include a NAND interface 1221 that processes communication with the semiconductor device 1100. The NAND interface 1221 may be used to transfer a control command to control the semiconductor device 1100, data which is intended to be written on the memory cell transistors MCT of the semiconductor device 1100, and/or data which is intended to be read from the memory cell transistors MCT of the semiconductor device 1100. The host interface 1230 may provide the electronic system 1000 with communication with an external host. When a control command is received through the host interface 1230 from an external host, the semiconductor device 1100 may be controlled by the processor 1210 in response to the control command.

For example, the second structure 1100S of FIG. 5 may correspond to or may be included in the first sub-chip CH1 of FIGS. 3 and 4. The first structure 1100F of FIG. 5 may correspond to or may be included in the second sub-chip CH2 of FIGS. 3 and 4.

FIG. 6 is a cross-sectional view showing a semiconductor structure according to some embodiments of the present inventive concepts.

Referring to FIG. 6, the first semiconductor structure SCT1, according to an embodiment, may include a first sub-chip CH1 and a second sub-chip CH2 in contact with a part of a top surface of the first sub-chip CH1. In an embodiment, the first sub-chip CH1 may be called a memory chip, and the second sub-chip CH2 may called a peripheral circuit chip.

The first sub-chip CH1 may include a first semiconductor substrate SB1, and may also include a source structure SC, a first stack structure ST1, and a second stack structure ST2 that are sequentially stacked on the first semiconductor substrate SB1. The first semiconductor substrate SB1 may include a first connection region CNR1, a second connection region CNR2, and a cell array region CAR between the first and second connection regions CNR1 and CNR2. The source structure SC may include a first source pattern SCP1 and a second source pattern SCP2. The first source pattern SCP1 and the second source pattern SCP2 may include polysilicon having the same doped impurities and different impurity concentrations. The second source pattern SCP2 may be interposed between the first source pattern SCP1 and the first semiconductor substrate SB1.

The first stack structure ST1 may include first electrode layers EL1 and inter-electrode dielectric layers EIL that are alternately and repeatedly stacked. The second stack structure ST2 may include second electrode layers EL2 and inter-electrode dielectric layers EIL that are alternately and repeatedly stacked. The first electrode layers EL1 may form a stepwise shape on the first connection region CNR1. The second electrode layers EL2 may form a stepwise shape on the first connection region CNR1. The inter-electrode dielectric layers EIL may also be interposed between the first stack structure ST1 and the source structure SC.

The source structure SC may correspond to the common source line CSL of FIG. 5. Lowermost and next to lowermost first electrode layers EL1 may correspond to the first and second gate lower lines LL1 and LL2 of FIG. 5. Uppermost and next to uppermost second electrode layers EL2 of may correspond to the first and second gate upper lines UL1 and UL2 of FIG. 5. Other first and second electrode layers EL1 and EL2 may correspond to the word lines WL of FIG. 5.

A vertical pattern VS may penetrate the second stack structure ST2, the first stack structure ST1, and the source structure SC, and may extend into a portion of the first semiconductor substrate SB1. The vertical pattern VS may be formed of an impurity-doped or impurity-undoped layer of single-crystalline silicon or polycrystalline silicon. A gate dielectric layer GL may be interposed between the vertical pattern VS and the second stack structure ST2, between the vertical pattern VS and the first stack structure ST1, between the first stack structure ST1 and the source structure SC, and between the source structure SC and the first semiconductor substrate SB1.

The gate dielectric layer GL may include a tunnel dielectric layer, a charge storage layer, and a blocking dielectric layer. The tunnel dielectric layer may be in contact with the vertical pattern VS. The blocking dielectric layer may be spaced apart from the tunnel dielectric layer across the charge storage layer. The charge storage layer may be a trap dielectric layer, a floating gate electrode, or a dielectric layer including conductive nano-dots. For example, the charge storage layer may include a silicon nitride layer, a silicon oxynitride layer, a silicon-rich nitride layer, a nano-crystalline silicon layer, and/or a laminated trap layer. The tunnel dielectric layer may be one of materials having a bandgap greater than that of the charge storage layer, and the blocking dielectric layer may be a high-k dielectric layer, such as an aluminum oxide layer and a hafnium oxide layer. The gate dielectric layer GL may further include a high-k dielectric layer. The high-k dielectric layer may be interposed between the blocking dielectric layer and the electrode layers EL1 and EL2 and between the inter-electrode dielectric layers EIL and the electrode layers EL1 and EL2. As used herein, the phrase "high-k dielectric layer" may be a dielectric layer having a dielectric constant greater than that of a silicon oxide layer and may include, for example, a metal oxide layer, such as a hafnium oxide layer or an aluminum oxide layer.

The vertical pattern VS may have a hollow cylindrical shape or a cup shape. A buried dielectric pattern 29 may fill an empty space in the vertical pattern VS. The vertical pattern VS may have an inflection point at a location between the first and second stack structures ST1 and ST2. The second source pattern SCP2 may penetrate the gate dielectric layer GL to come into contact with a sidewall of the vertical pattern VS. A channel pad VSPD may be disposed on the vertical pattern VS and on the buried dielectric pattern 29. The channel pad VSPD may include an impurity-doped layer of single-crystalline silicon or polycrystalline silicon.

On the first and second connection regions CNR1 and CNR2, the first stack structure ST1 and the source structure SC may have their ends that are covered with a first planarized dielectric layer PL1, and the second stack structure ST2 may have an end that is covered with a second planarized dielectric layer PL2. The first and second planarized dielectric layer PL1 and PL2 may include, for example, a silicon oxide layer.

The second stack structure ST2 and the second planarized dielectric layer PL2 may be covered with a first internal interlayer dielectric layer IIL1. Bit-line contacts BLPLG may penetrate the first internal interlayer dielectric layer IIL1 to come into contact with corresponding channel pads VSPD.

On the first connection region CNR1, cell contacts CC1 may penetrate the first internal interlayer dielectric layer IIL1, the planarized dielectric layers PL1 and PL2, and the inter-electrode dielectric layers EIL, thereby contacting the electrode layers EL1 and EL2.

On the second connection region CNR2, an impurity doped region IPR may be formed in the first semiconductor substrate SB1. The first semiconductor substrate SB1 and the impurity doped region IPR may be doped with impurities having the same conductivity type. The impurity doped region IPR may be doped with impurities whose concentration is greater than that of impurities doped in the first semiconductor substrate SB1. A substrate contact plug CC2 may penetrate the first internal interlayer dielectric layer IIL1, the planarized dielectric layers PL1 and PL2, and the inter-electrode dielectric layers EIL, thereby contacting the impurity doped region IPR. A ground or erase voltage may be applied through the substrate contact plug CC2 to the first semiconductor substrate SB1.

The first internal interlayer dielectric layer IIL1 may be provided with bit lines BL in contact with the bit-line contacts BLPLG. The bit lines BL may correspond to the bit lines BL of FIG. 5.

The first internal interlayer dielectric layer IIL1 and the bit lines BL may be covered with a second internal interlayer dielectric layer IIL2. The second internal interlayer dielectric layer IIL2 may be formed of stacked dielectric layers. The second internal interlayer dielectric layer IIL2 may have first chip internal lines IC1_1 to IC1_3 disposed thereon.

The second sub-chip CH2 may overlap at least the first connection region CNR1 of the first sub-chip CH1. The second sub-chip CH2 may overlap the cell contacts CC1. The second sub-chip CH2 may expose a large portion of the cell array region CAR. The second sub-chip CH2 may expose the second connection region CNR2.

The second sub-chip CH2 may include a second semiconductor substrate SB2 on which a device isolation layer Fox is disposed to define active sections. A first transistor TR1 and a second transistor TR2 may be disposed on the second semiconductor substrate SB2. The first transistor TR1 may correspond to one of transistors included in the page buffer 1120 of FIG. 5. The second transistor TR2 may correspond to one of transistors included in the decoder circuit 1110 of FIG. 5.

The first and second transistors TR1 and TR2 may be covered with a second interlayer dielectric layer IL2. The second interlayer dielectric layer IL2 may have a plurality of stacked second chip internal lines IC2 disposed thereon. Ones of the second chip internal lines IC2 may be connected to the second connection pads CP2. A bottom surface of the second semiconductor substrate SB2 may be covered with a first passivation layer PSL1. A through via TSV may penetrate the first passivation layer PSL1, the second semiconductor substrate SB2, the device isolation layer Fox, and a portion of the second interlayer dielectric layer IL2, thereby contacting one of the second chip internal lines IC2. The through via TSV may have a lateral surface surrounded by a via dielectric layer TVL, and may thus be insulated from the second semiconductor substrate SB2.

One of the bit lines BL in the first sub-chip CH1 may be connected to the first transistor TR1 of the second sub-chip CH2 through one IC1_1 of the first chip internal lines IC1_1 to IC1_3, one of the first connection pads CP1, one of the second connection pads CP2, and one or more of the second chip internal lines IC2.

One of the cell contacts CC1 in the first sub-chip CH1 may be connected to the second transistor TR2 of the second sub-chip CH2 through another IC1_2 of the first chip internal lines IC1_1 to IC1_3, another of the first connection pads CP1, another of the second connection pads CP2, and another or more of the second chip internal lines IC2.

Another IC1_3 of the first chip internal lines IC1_1 to IC1_3 may be electrically connected through the substrate contact plug CC2 to another of the first connection pads CP1.

EUV exposure processes may be performed when forming the second chip internal lines IC2 and the first and second transistors TR1 and TR2 in the second sub-chip CH2 in order to reduce a size of the second sub-chip CH2. In addition, the first and second transistors TR1 and TR2 may have a planar type as illustrated in FIG. 6, or alternatively may have a fin field effect transistor (FinFET) or multi-bridge channel field effect transistor (MBCFET) type in which active fins protrude from the second substrate SB2. The FinFET and MBCFET devices may exhibit the same performance even in a relatively small area, compared to planar type transistors. The FinFET type transistor may be configured such that a gate electrode covers top and lateral surfaces of an active fin that protrudes from a semiconductor substrate. The MBCFET type transistor may be configured such that a plurality semiconductor patterns are stacked on an active fin or a semiconductor substrate, and that a gate electrode covers the semiconductor patterns and intervenes between the semiconductor pattern and the active fin or the semiconductor substrate. A gate dielectric layer may be interposed between the gate electrode and one or more of the active fin, the semiconductor pattern, and the semiconductor substrate.

The following will describe a method of fabricating the semiconductor package of FIG. 2.

Figure 7:
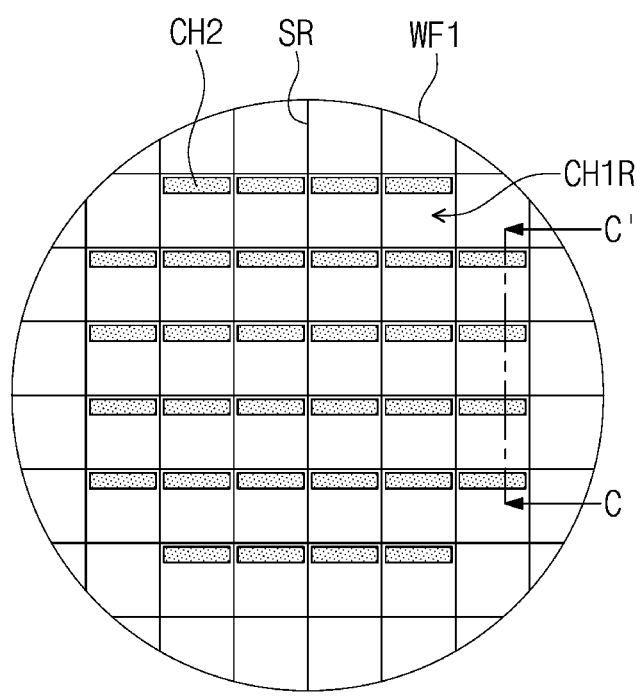
FIG. 7 is a plan view showing a method for fabricating a semiconductor package according to some embodiments of the present inventive concepts.
Figure 8A:
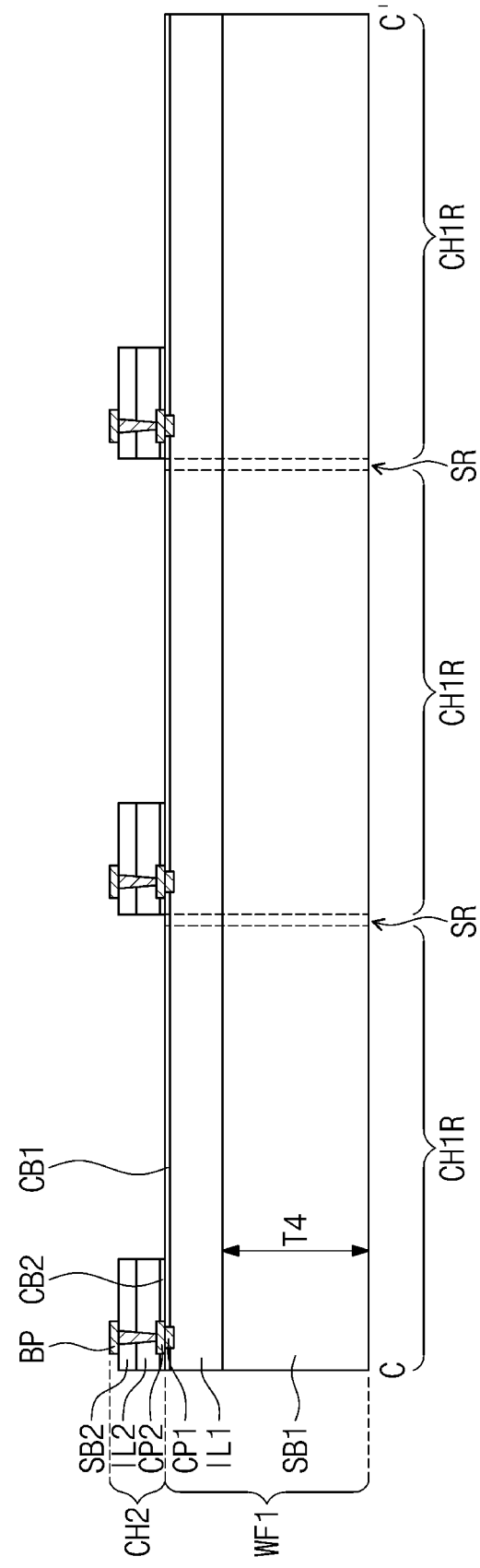

FIG. 7 is a plan view showing a method for fabricating a semiconductor package according to some embodiments of the present inventive concepts. FIGS. 8A to 8E illustrate cross-sectional views showing a method of fabricating the semiconductor package of FIG. 2. FIG. 8A may correspond to a cross-section taken along line C-C' of FIG. 7.

Referring to FIGS. 7 and 8A, a first wafer structure WF1 may be prepared. The first wafer structure WF1 may include first sub-chip regions CH1R and a scribe lane region SR between the first sub-chip regions CH1R. Each of the first sub-chip regions CH1R may include the structure of the first sub-chip CH1 discussed with reference to FIG. 4 and/or FIG. 6. For the first wafer structure WF1, the first semiconductor substrate SB1 may have a fourth thickness T4 greater than the third thickness T3 of the first sub-chip CH1 of FIG. 4. After the preparation of the first wafer structure WF1, second sub-chips CH2 may be prepared. Each of the second sub-chips CH2 may have the structure of the second sub-chip CH2 discussed with reference to FIG. 4 and/or FIG. 6. Each of the second sub-chips CH2 may be tested to select known-good dies with no failure. The known-good second sub-chips CH2 may be correspondingly placed on the first sub-chip regions CH1R of the first wafer structure WF1. Under the state where the adhesive layers CB1 and CB2 are in contact with each other and the connection pads CP1 and CP2 are in contact with each other, an annealing or thermo-compression process may be performed to bond the second sub-chips CH2 to the first wafer structure WF1. In this stage, applied heat may cause the connection pads CP1 and CP2 to have the shape as shown in FIG. 4. The second sub-chip CH2 may be bonded to overlap a portion of one first sub-chip region CH1R and to expose a remaining portion of one first sub-chip region CH1R. When viewed in one direction, a width of the second sub-chip CH2 may be about ½₀ to about ¼ of that of the first sub-chip region CH1R. Alternatively, the second sub-chip CH2 may have an area about ½₀ to about ¼ of that of the first sub-chip region CH1R.

In the present inventive concepts, a second sub-chip CH2 may be fabricated separately from the first wafer structure WF1 which will be a first sub-chip CH1. When the second sub-chip CH2 is fabricated, it may be required to perform an annealing or high-temperature process several times. In a case, instead of individually separating the second sub-chip CH2, the second sub-chip CH2 is fabricated on a semiconductor substrate when the first sub-chip CH1 is manufactured on the same semiconductor substrate, memory cells included in the first sub-chip CH1 may be damaged due to heat generated in the high-temperature process. In contrast, according to the present inventive concepts, the second sub-chip CH2 may be fabricated separately from the first sub-chip CH1, and thus it may be possible to prevent the memory cells from being damaged due to heat. Accordingly, a semiconductor structure (device) may increase in reliability.

The way to bond the second sub-chip CH2 to the first wafer structure WF1 may be easier and simpler than the conventional way to bond a wafer to another wafer. Moreover, because only the tested known-good dies are bonded, semiconductor package failures may decrease, yield may increase, and manufacturing costs may be reduced.

Referring to FIG. 8B, a tape layer TBL may be attached onto the first wafer structure WF1 and the second sub-chips CH2. The tape layer TBL may have a flat top surface and a protrusion that can fill a space between neighboring second sub-chips CH2. One or more of an adhesive layer and a release layer may be additionally interposed between the tape layer TBL and the first wafer structure WF1 and between the tape layer TBL and the second sub-chips CH2.

Figure 8C:
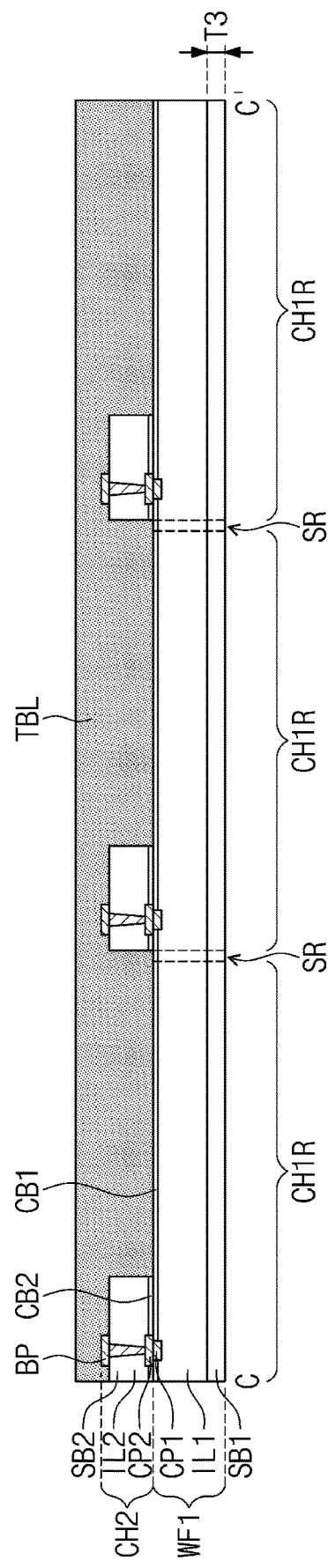

Referring to FIGS. 8B and 8C, a back grinding process may be performed in which a portion of the first semiconductor substrate SB1 may be removed to reduce its fourth thickness T4 to the third thickness T3 of the first sub-chip CH1.

Figure 8D:
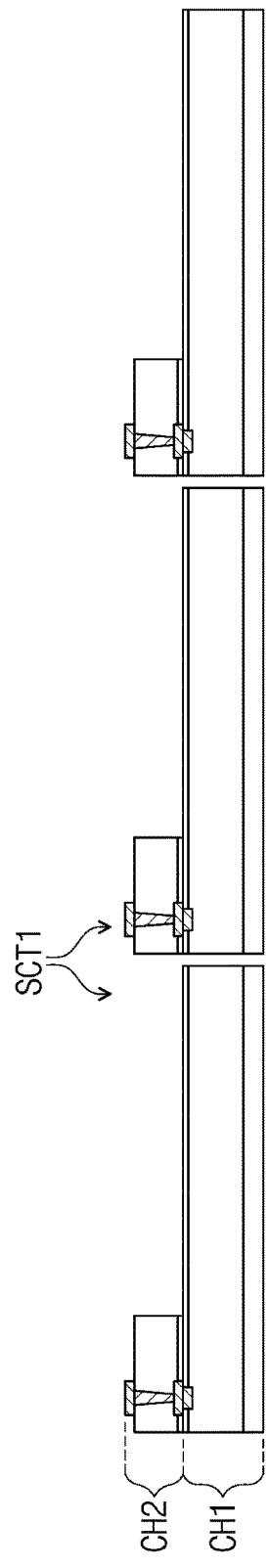

Referring to FIGS. 8C and 8D, the tape layer TBL may be removed, and then a singulation process may be performed in which the first wafer structure WF1 may be cut along the scribe lane region SR to form first semiconductor structures SCT1 that are individually separated from each other. The first semiconductor structures SCT1 may each undergo a test process to select known-good dies except for failed dies.

Figure 8E:
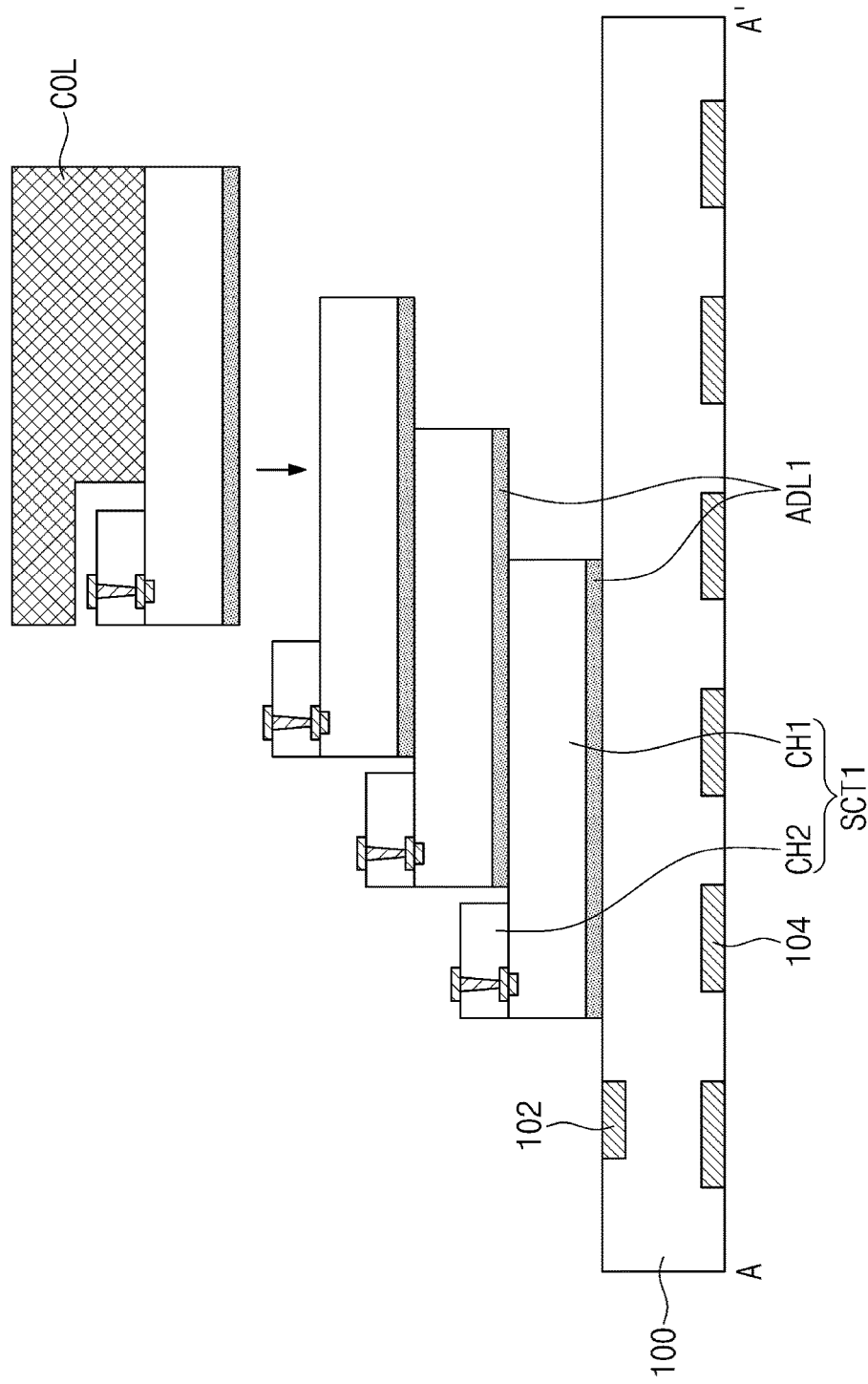

Referring to FIG. 8E, a first adhesive layer ADL1 may be attached to a bottom surface of each of the first semiconductor structures SCT1 with no failure. A collet with a protrusion may be used such that the first semiconductor structures SCT1 may be stacked offset from each other to form a stepwise shape.

Referring back to FIG. 2, a wire bonding process may be performed to form first wires WR1 that connect the bonding pads BP to the upper conductive pads 102. A mold layer MD may be formed, and external connection terminals 106 may be bonded to fabricate a semiconductor package 200 of FIG. 2.

Figure 9:
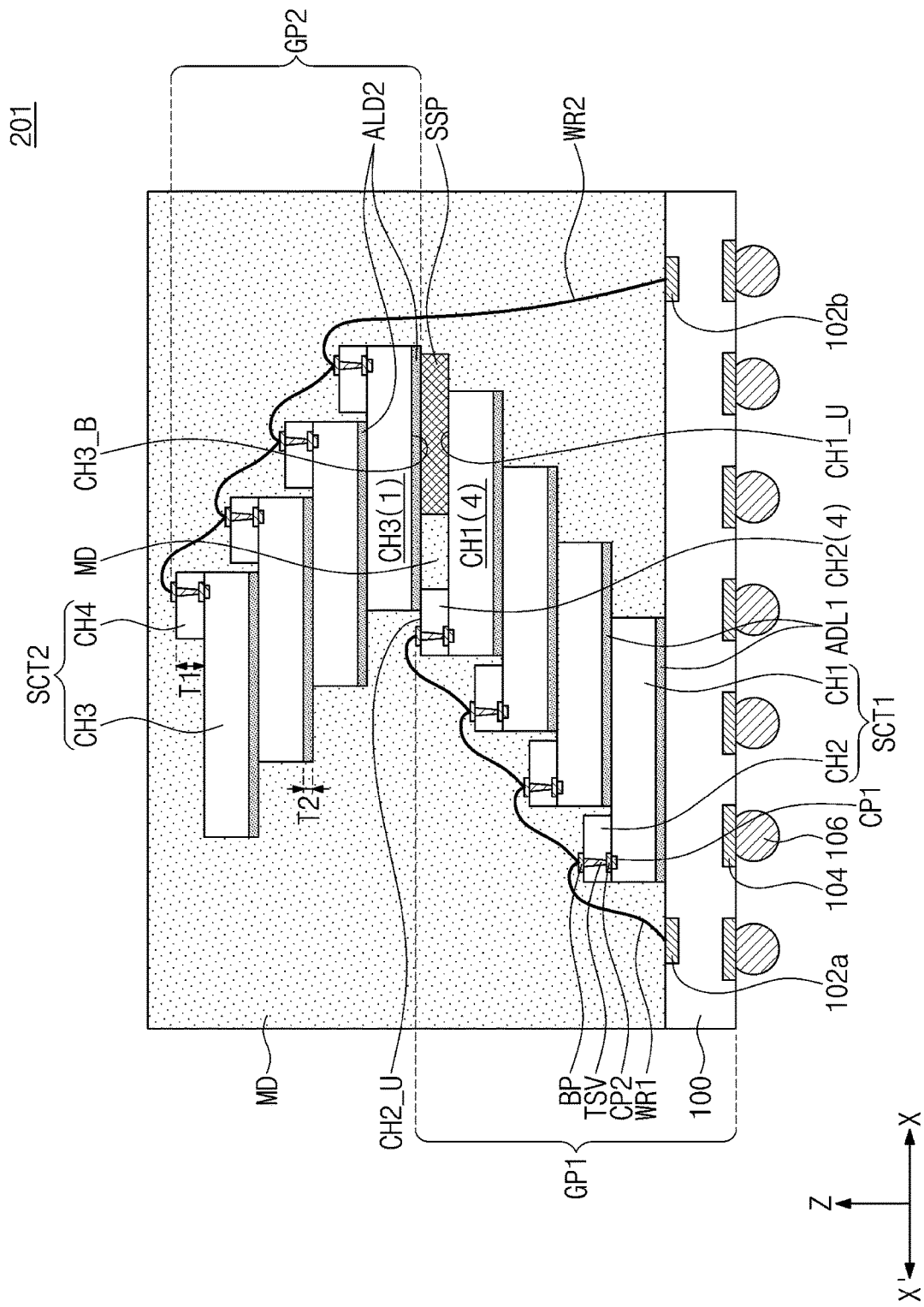
FIG. 9 is a cross-sectional view showing a semiconductor package according to some example embodiments of the present inventive concepts.

FIG. 9 is a cross-sectional view showing a semiconductor package according to some embodiments of the present inventive concepts.

Referring to FIG. 9, a semiconductor package 201, according to an embodiment, may be configured such that a first upper conductive pad 102a and a second upper conductive pad 102b may be spaced apart from each other on a package substrate 100. The package substrate 100 may be provided with first semiconductor structures SCT1 included in a first group GP1 that are stacked offset from each other in a first direction X. The first semiconductor structures SCT1 of the first group GP1 may be the same as the first semiconductor structures SCT1 discussed with reference to FIG. 2. The semiconductor package 201 may further include second semiconductor structures SCT2 of a second group GP2 disposed on the first group GP1, and may also include second adhesive layers ADL2 disposed between the second semiconductor structures SCT2. The second semiconductor structures SCT2 may be stacked offset from each other in a direction X' opposite to the first direction X.

Each of the second semiconductor structures SCT2 may include a third sub-chip CH3 and a fourth sub-chip CH4. The third sub-chip CH3 and the fourth sub-chip CH4 may be electrically connected with each other and may have different functions from each other. For example, like the first sub-chip CH1 of FIG. 2, the third sub-chip CH3 may have a memory function. Like the second sub-chip CH2 of FIG. 2, the fourth sub-chip CH4 may have a function to drive the third sub-chip CH3. The third sub-chip CH3 may include a memory cell array the same as or different from that of the first sub-chip CH1. The fourth sub-chip CH4 may include a core region, a peripheral circuit region, and/or a logic region the same as or different from that of the second sub-chip CH2. The third sub-chip CH3 may have the same structure as that of the first sub-chip CH1 discussed with reference to FIGS. 3 to 6. The fourth sub-chip CH4 may have the same structure as that of the second sub-chip CH2 discussed with reference to FIGS. 3 to 6. The fourth sub-chip CH4 may have a first thickness T1 that is greater than a second thickness T2 of the second adhesive layer ADL2.

The second sub-chip CH2(4) of an uppermost one of the first semiconductor structures SCT1 may have a top surface CH2_U that is lower than a bottom surface CH3_B of the third sub-chip CH3(1) of a lowermost one of the second semiconductor structures SCT2. As used herein, "lower" may refer to a direction closer to the package substrate 100, without regard to a direction in which gravity pulls.

A support pattern SSP may be interposed between the third sub-chip CH3(1) of the lowermost second semiconductor structure SCT2 and the first sub-chip CH1(4) of the uppermost first semiconductor structure SCT1. The support pattern SSP may be a dummy semiconductor die. Alternatively, the support pattern SSP may include a dielectric material or a semiconductor material. The support pattern SSP may have a thickness that corresponds to a value obtained by subtracting a thickness of the bonding pad BP from the first thickness T1 of the second sub-chip CH2(4).

The second adhesive layer ADL2 may cover the bottom surface CH3_B of the third sub-chip CH3(1) included in the lowermost second semiconductor structure SCT2. Below the uppermost third sub-chip CH3(1), the second adhesive layer ADL2 may be in contact with both the support pattern SSP and the uppermost second sub-chip CH2(4).

A first wire WR1 may connect the bonding pads BP of the first semiconductor structures SCT1 and may contact the first upper conductive pad 102a. A second wire WR2 may connect the bonding pads BP of the second semiconductor structures SCT2 and may contact the second upper conductive pad 102b. A mold layer MD may cover the first semiconductor structures SCT1, the second semiconductor structures SCT2, the wires WR1 and WR2, and the package substrate 100. The mold layer MD may be interposed between the uppermost second sub-chip CH2(4) and the support pattern SSP. Other configurations may be identical or similar to those discussed above.

Figure 10:
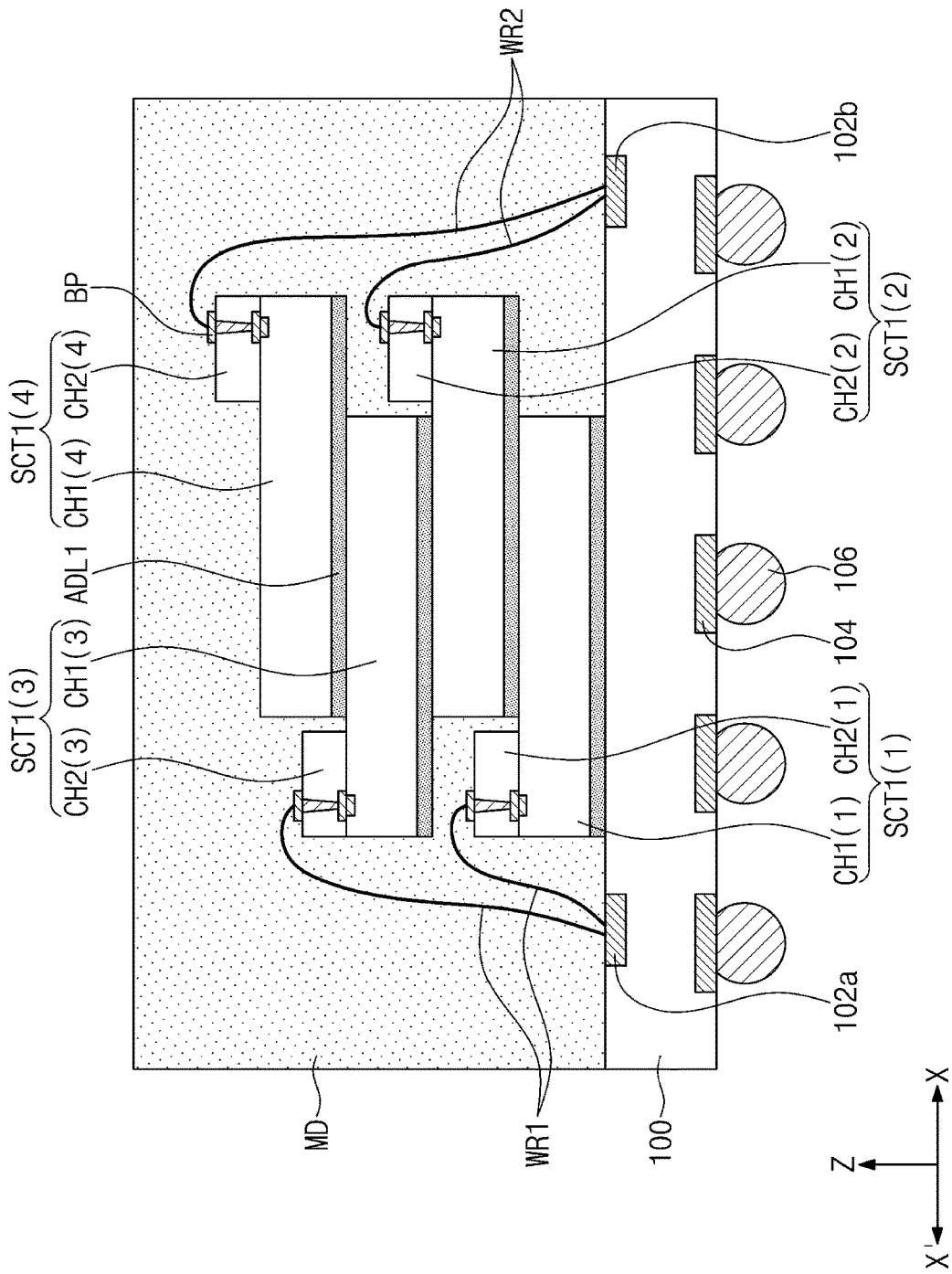
FIG. 10 is a cross-sectional view showing a semiconductor package according to some example embodiments of the present inventive concepts.

FIG. 10 is a cross-sectional view showing a semiconductor package according to some embodiments of the present inventive concepts.

Referring to FIG. 10, a semiconductor package 202, according to an embodiment, may be configured such that the first semiconductor structures SCT1 may be stacked alternately in the first direction X and in an opposite direction X' to the first direction X. For example, odd-numbered first semiconductor structures SCT1(1) and SCT1(3) may be disposed such that the second sub-chips CH2(1) and CH2(3) may be exposed in the opposite direction X' to the first direction X. In contrast, even-numbered first semiconductor structures SCT1(2) and SCT1(4) may be disposed such that the second sub-chips CH2(2) and CH2(4) may be exposed in the opposite direction X' to the first direction X. The first wires WR1 may connect the bonding pads BP of the odd-numbered stacked first semiconductor structures SCT1(1) and SCT1(3) and may contact the first upper conductive pads 102a. The second wires WR2 may connect the bonding pads BP of the even-numbered stacked first semiconductor structures SCT1(2) and SCT1(4) and may contact the second upper conductive pads 102b. The odd-numbered stacked second sub-chips CH2(1) and CH2(3) may overlap each other, and the even-numbered stacked second sub-chips CH2(2) and CH2(4) may overlap each other. The mold layer MD may be interposed between the odd-numbered stacked second sub-chips CH2(1) and CH2(3) and between the even-numbered stacked second sub-chips CH2(2) and CH2(4). Other configurations may be identical or similar to those discussed above.

Figure 11A:
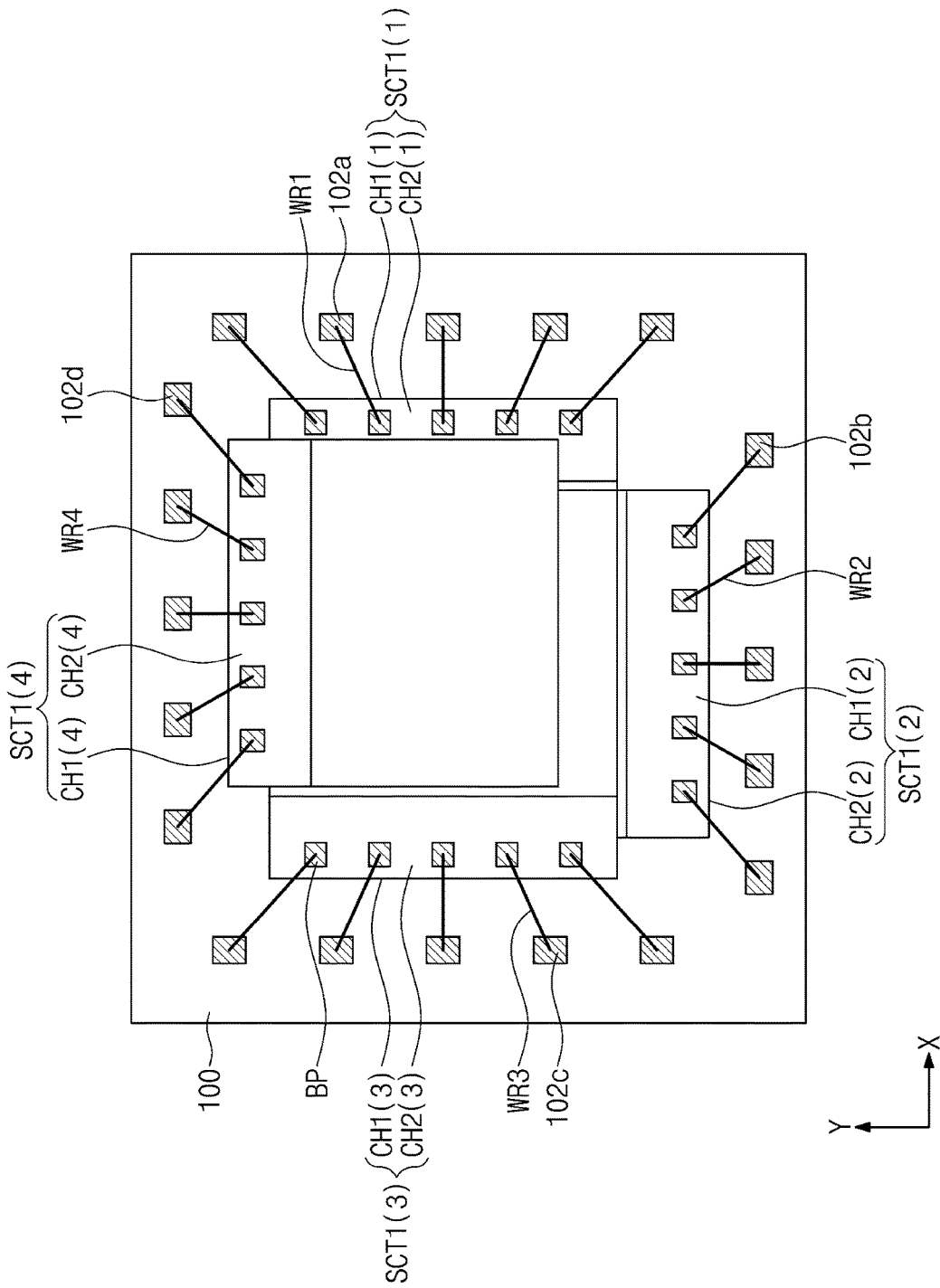
FIG. 11A is a plan view showing a semiconductor package according to some embodiments of the present inventive concepts.
Figure 11B:
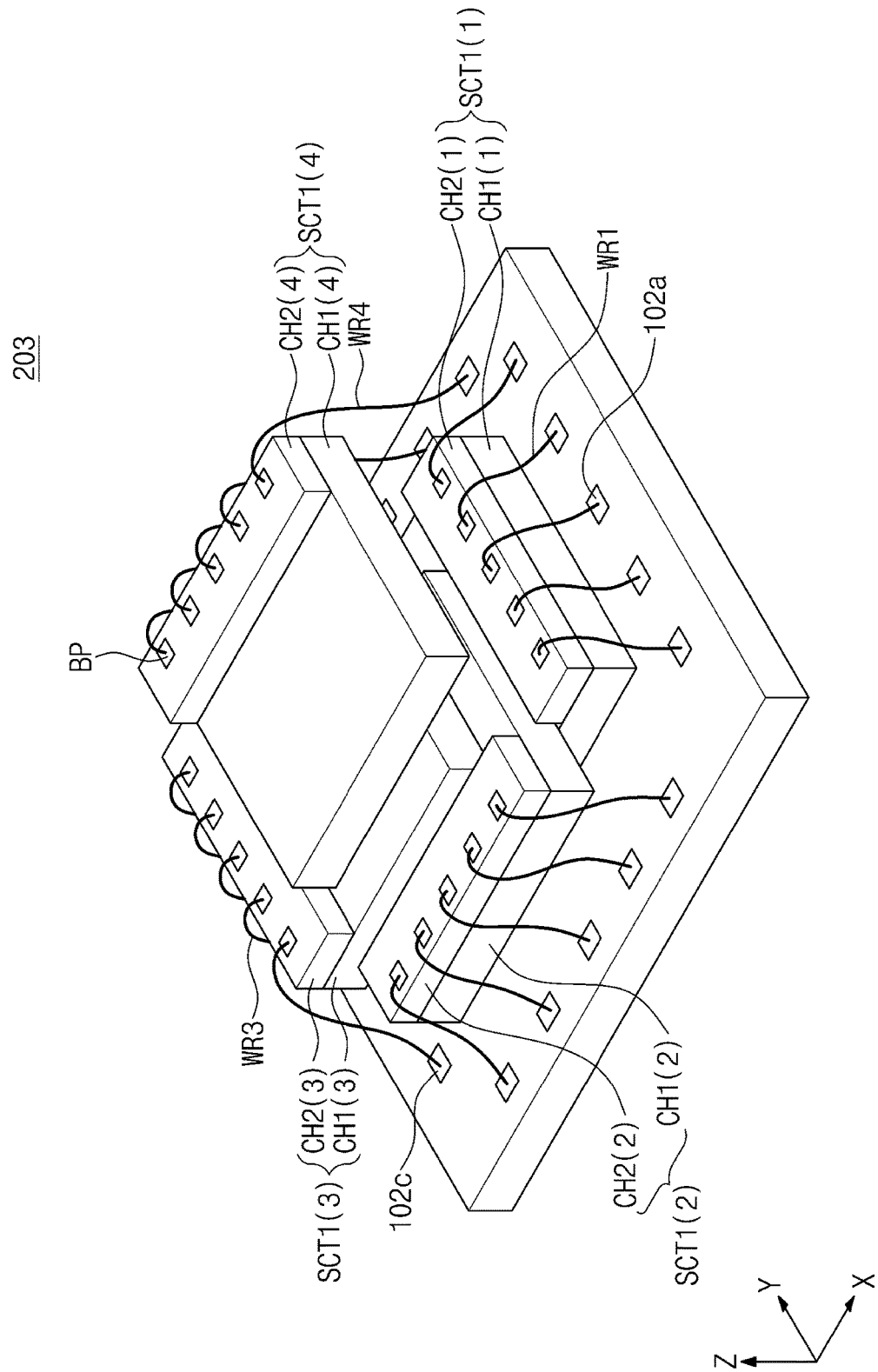
FIG. 11B is a perspective view showing the semiconductor package of FIG. 11A.

FIG. 11A is a plan view showing a semiconductor package according to some embodiments of the present inventive concepts. FIG. 11B is a perspective view showing the semiconductor package of FIG. 11A.

Referring to FIGS. 11A and 11B, a semiconductor package 203, according to an embodiment, may be configured such that the first semiconductor structures SCT1 may be rotationally stacked at every 90 degrees in a clockwise direction (e.g., each next chip is rotated clockwise 90 degrees with respect to the prior chip). For example, the lowermost first semiconductor structure SCT1(1) may be disposed such that the second sub-chip CH2(1) may be directed toward the first direction X. The first semiconductor structure SCT1(2) at second to bottom may be disposed such that the second sub-chip CH2(2) may be directed toward a direction (or an opposite direction to the second direction Y) that is horizontally rotated at 90 clockwise degrees from the first direction X. The first semiconductor structure SCT1(3) at third to bottom may be disposed such that the second sub-chip CH2(3) may be directed toward a direction (or an opposite direction to the first direction X) that is horizontally rotated at 180 clockwise degrees from the first direction X. The uppermost first semiconductor structure SCT1(4) may be disposed such that the second sub-chip CH2(4) may be directed toward a direction (or the second direction Y) that is horizontally rotated at 270 clockwise degrees from the first direction X.

The package substrate 100 may be provided with first, second, third, and fourth upper conductive pads 102a, 102b, 102c, and 102d that are spaced apart from each other. The bonding pads BP of the lowermost first semiconductor structure SCT1(1) may be connected through the first wires WR1 to the first upper conductive pads 102a. The bonding pads BP of the first semiconductor structure SCT1(2) at second to bottom may be connected through the second wires WR2 to the second upper conductive pads 102b. The bonding pads BP of the first semiconductor structure SCT1 (3) at third to bottom may be connected through the third wires WR3 to the third upper conductive pads 102c. The bonding pads BP of the first semiconductor structure SCT1 (4) at fourth to bottom may be connected through the fourth wires WR4 to the fourth upper conductive pads 102d. In an embodiment, the first semiconductor structures SCT1 may be the same as or different from each other.

Although FIGS. 11A and 11B depict a stack structure in which four first semiconductor structures SCT1 are stacked, the stack structure may be changed to have a plurality of repeatedly stacked groups each of which includes the four first semiconductor structures SCT1. Other configurations may be identical or similar to those discussed above.

Figure 12:
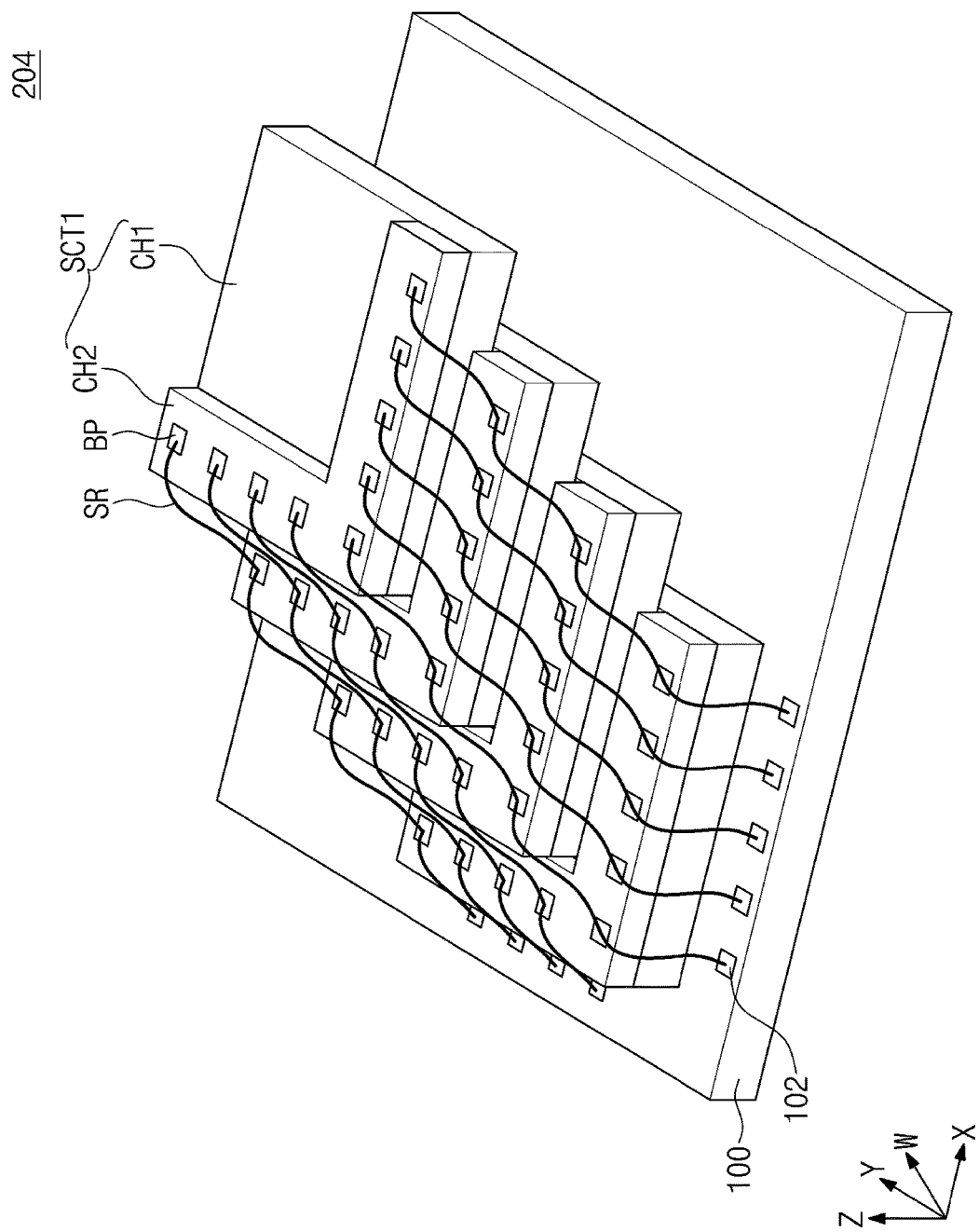
FIG. 12 is a perspective view showing a semiconductor package according to some embodiments of the present inventive concepts.

FIG. 12 is a perspective view showing a semiconductor package according to some embodiments of the present inventive concepts.

Referring to FIG. 12, a semiconductor package 204, according to an embodiment, may be configured such that the second sub-chips CH2 may each have an "L" shape. For example, a portion of the second sub-chip CH2 may extend in a first direction X, and another portion of the second sub-chip CH2 may extend from the portion in a second direction Y that horizontally intersects the first direction X. The bonding pads BP on the second sub-chip CH2 may be disposed to constitute an "L" shape. The upper conductive pads 102 on the package substrate 100 may be disposed to constitute an "L" shape. The first semiconductor structures SCT1 may stacked offset from each other in a third direction W that intersects both of the first and second directions X and Y. Other configurations may be identical or similar to those discussed above with reference to FIG. 2.

The first semiconductor structures SCT1 of FIG. 12 may be stacked like the structure of FIG. 10. For example, the first semiconductor structures SCT1 may be stacked alternately and repeatedly in the third direction W and in an opposite direction to the third direction W.

Figure 13:
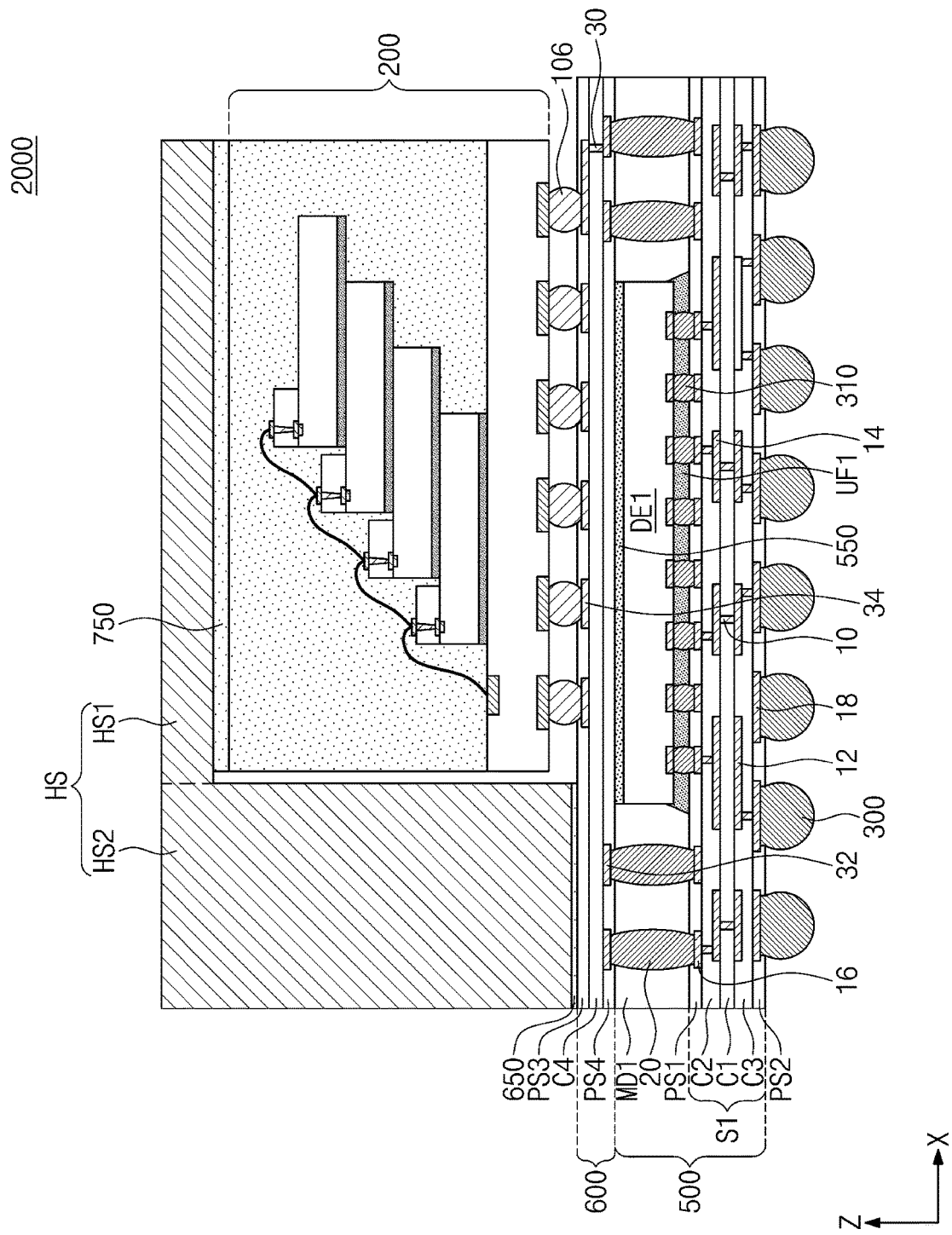
FIG. 13 is a cross-sectional view showing a semiconductor package according to some embodiments of the present inventive concepts.

With reference to FIGS. 13 to 15, the following will describe a package-on-package structure to which is applied the semiconductor package of the present inventive concepts.

FIG. 13 is a cross-sectional view showing a semiconductor package according to some embodiments of the present inventive concepts.

Referring to FIG. 13, a semiconductor package 2000, according to an embodiment, may include a first sub-semiconductor package 500, a wiring structure 600, a second sub-semiconductor package 200, and a thermal radiation member HS that are sequentially stacked. The second sub-semiconductor package 200 may be the same as the semiconductor package 200 discussed with reference to FIG. 2. The first sub-semiconductor package 500 and the wiring structure 600 may have the same width in a first direction X. The first sub-semiconductor package 500 and the wiring structure 600 may have their sidewalls aligned with each other. The second sub-semiconductor package 200 may have a width that is less than that of the wiring structure 600. The second sub-semiconductor package 200 may expose a portion of the wiring structure 600.

The thermal radiation member HS may include a material whose thermal conductivity is high, such as a metal or grapheme. The thermal radiation member HS may include a first thermal radiation part HS1 that overlaps the second sub-semiconductor package 200 and a second thermal radiation part HS2 that extends toward the wiring structure 600 from a sidewall of the first thermal radiation part HS1. The first and second thermal radiation parts HS1 and HS2 may be integrally united with each other, and no boundary may be present therebetween. The second thermal radiation part HS2 may be thicker than the first thermal radiation part HS1. In an embodiment, the second thermal radiation part HS2 may have an "L" shape in a plan view.

The first sub-semiconductor package 500 may include a first substrate S1, a first semiconductor device DE1 mounted on the first substrate S1, and a first mold layer MD1 that covers a sidewall of the first semiconductor device DE1. The first substrate S1 may be, for example, a multi-layered printed circuit board. The first substrate S1 may include a first body layer C1, a second body layer C2, and a third body layer C3. Each of the first, second, and third body layers C1, C2, and C3 may include a dielectric material. For example, each of the first, second, and third body layers C1, C2, and C3 may be formed of a thermosetting resin such as epoxy resin, a thermoplastic resin such as polyimide, or a resin in which a thermosetting or thermoplastic resin is impregnated with a reinforcement such as glass fiber and/or inorganic filler, which impregnated resin includes a prepreg, a fire resist-4 (FR4), or a photosensitive resin, but the present inventive concepts are not necessarily limited thereto.

The second body layer C2 may be positioned on the first body layer C1, and the third body layer C3 may be positioned below the first body layer C1. The first body layer C1 may include first internal lines 14 on a top surface thereof, and may also include second internal lines 12 on a bottom surface thereof. First upper conductive patterns 16 may be disposed on the second body layer C2, and first lower conductive patterns 18 may be disposed on a bottom surface of the third body layer C3. A first upper passivation layer PS1 may be disposed on the second body layer C2, and may expose the first upper conductive patterns 16. A first lower passivation layer PS2 may be disposed below the third body layer C3, and may expose the first lower conductive patterns 18. First circuit vias 10 may be disposed in the first, second, and third body layers C1, C2, and C3, and the first circuit vias 10 may electrically connect the first and second internal lines 14 and 12 to the first upper and lower conductive patterns 16 and 18. The first upper and lower passivation layers PS1 and PS2 may be a photosensitive solder resist (PSR) layer. External connection terminals 300 may be bonded to the first lower conductive patterns 18. The external connection terminals 300 may include solder balls, conductive bumps, and/or conductive pillars. The external connection terminal 300 may include tin, lead, aluminum, gold, and/or nickel.

The first semiconductor device DE1 may be a semiconductor die (or semiconductor chip) or a semiconductor package that includes a plurality of semiconductor dies of the same or different types. The first semiconductor device DE1 may be an image sensor chip, such as CMOS image sensor (CIS), a microelectromechanical system (MEMS) device chip, an application specific integrated circuit (ASIC) chip, and/or a memory device chip such as Flash memory, DRAM, SRAM, EEPROM, PRAM, MRAM, ReRAM, HBM (high bandwidth memory), and/or HMC (hybrid memory cubic). The first semiconductor device DE1 may be flip-chip bonded through first internal connection members 310 to one or more of the first upper conductive patterns 16. The first internal connection members 310 may include solder balls, conductive bumps, and/or conductive pillars. A first under-fill layer UF1 may be interposed between the first semiconductor device DE1 and the first substrate S1. The first under-fill layer UF1 may include a thermo-curable resin or a photo-curable resin. In addition, the first under-fill layer UF1 may further include organic fillers or inorganic fillers.

The first mold layer MD1 may cover a sidewall of the first semiconductor device DE1 and a top surface of the first substrate S1. The first mold layer MD1 may include a dielectric resin, such as epoxy molding compound (EMC). The first mold layer MD1 may further include fillers, and the fillers may be dispersed in the dielectric resin.

The wiring structure 600 may be a double-sided printed circuit board. For example, the wiring structure 600 may include a fourth body layer C4, second upper conductive patterns 34 on a top surface of the fourth body layer C4, and second lower conductive patterns 32 on a bottom surface of the fourth body layer C4. Second circuit vias 30 may penetrate the fourth body layer C4, and may electrically connect the second upper conductive patterns 34 to the second lower conductive patterns 32. The fourth body layer C4 may include, for example, a material that is the same as or similar to that of the first body layer C1. Alternatively, the fourth body layer C4 may include silicon. In an embodiment, the wiring structure 600 may be called an interposer substrate. In this description, a body layer may be called a dielectric layer.

A second upper passivation layer PS3 may be disposed on the fourth body layer C4, and may expose the second upper conductive patterns 34. A second lower passivation layer PS4 may be disposed on a bottom surface of the fourth body layer C4, and may expose the second lower conductive patterns 32. The second upper and lower passivation layers PS3 and PS4 may include the same material as that of the first upper and lower passivation layers PS1 and PS2.

A first thermal interface material layer 550 may be interposed between the wiring structure 600 and the first sub-semiconductor package 500. The first thermal interface material layer 550 may be in contact with a bottom surface of the second lower passivation layer PS4 and also with a top surface of the first semiconductor device DE1. The first thermal interface material layer 550 may include a grease or a thermo-curable resin layer. The first thermal interface material layer 550 may further include filler particles dispersed in the thermo-curable resin layer. The filler particles may include a graphene power or a metal power whose thermal conductivity is high. Alternatively, the filler particles may include silica, alumina, zinc oxide, and/or boron nitride.

Second internal connection members 20 may penetrate the first mold layer MD1 and may electrically connect the wiring structure 600 to the first substrate S1 of the first sub-semiconductor package 500. The second internal connection members 20 may connect ones of the first upper conductive patterns 16 to ones of the second lower conductive patterns 32. The second internal connection members 20 may be solder balls, conductive bumps, and/or conductive pillars.

A second thermal interface material layer 650 may be interposed between the second thermal radiation part HS2 and the wiring structure 600. The second thermal interface material layer 650 may include a material that is the same as or similar to that of the first thermal interface material layer 550. A third thermal interface material layer 750 may be interposed between the second sub-semiconductor package 200 and the first thermal radiation part HS1. The third thermal interface material layer 750 may include a material that is the same as or similar to that of the first thermal interface material layer 550.

Figure 14A:
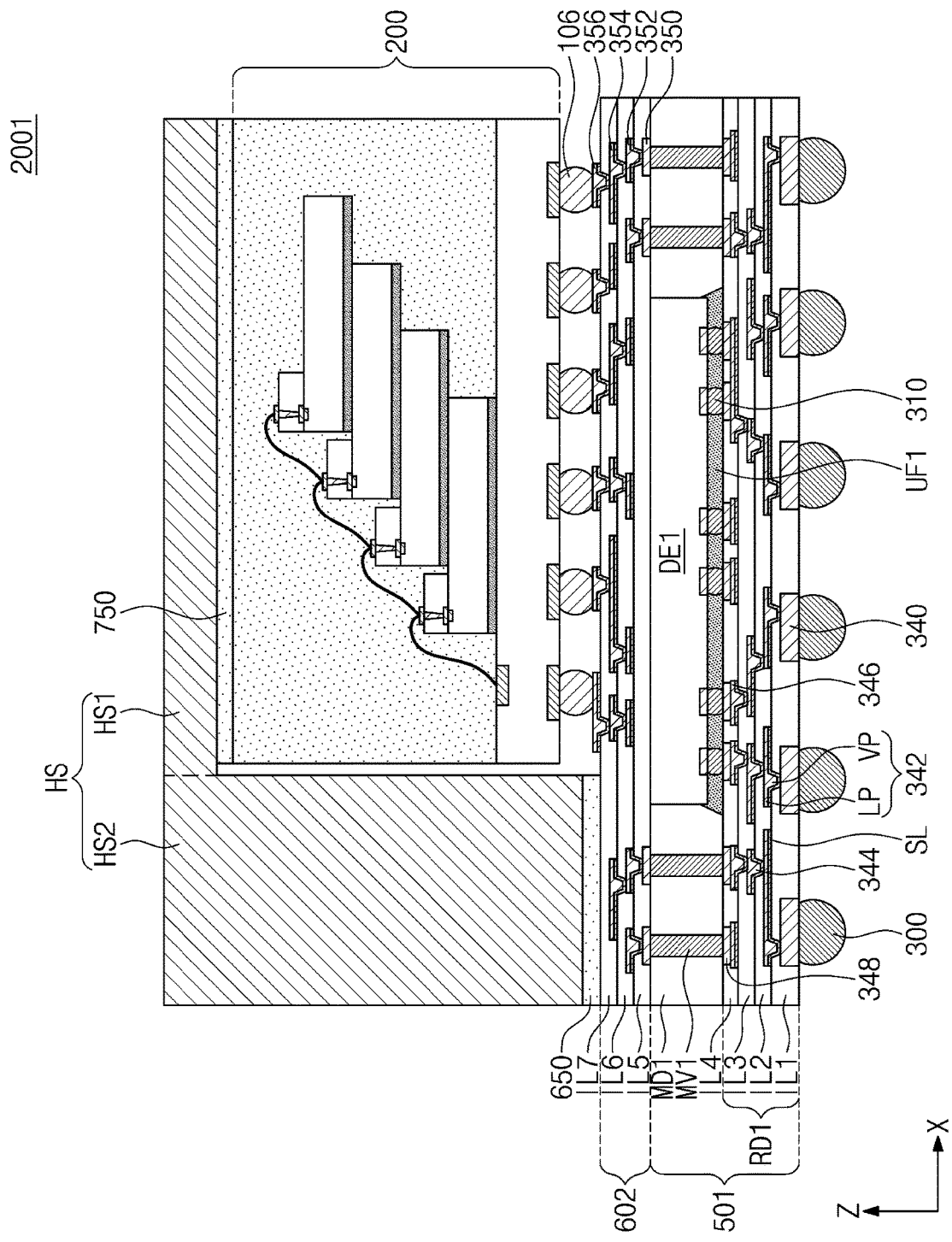
FIG. 14A is a cross-sectional view showing a semiconductor package according to some embodiments of the present inventive concepts.

FIG. 14A is a cross-sectional view showing a semiconductor package according to some embodiments of the present inventive concepts.

Referring to FIG. 14A, a semiconductor package 2001, according to an embodiment, may include a first sub-semiconductor package 501, a wiring structure 602, a second sub-semiconductor package 200, and a thermal radiation member HS that are sequentially stacked. The first sub-semiconductor package 501 may be shaped like a chip last type fan-out wafer level package (FOWLP). The first sub-semiconductor package 501 may include a first redistribution substrate RD1, a first semiconductor device DE1 mounted on the first redistribution substrate RD1, and a first mold layer MD1 that covers the first semiconductor device DE1. The first semiconductor device DE1 may be flip-chip bonded through first internal connection members 310 to the first redistribution substrate RD1.

The first redistribution substrate RD1 may include first, second, third, and fourth interlayer dielectric layers IL1, IL2, IL3, and IL4 (referred to hereinafter as first, second, third, and fourth redistribution dielectric layers) that are sequentially stacked. The first, second, third, and fourth redistribution dielectric layers IL1, IL2, IL3, and IL4 may be photo-imagable dielectric (PID) layers. First, second, and third redistribution patterns 342, 344, and 346 may be disposed between the first, second, third, and fourth redistribution dielectric layers IL1, IL2, IL3, and IL4. The first, second, and third redistribution patterns 342, 344, and 346 may include an electrically conductive material, such as a metal. Each of the first, second, and third redistribution patterns 342, 344, and 346 may include a via part VP and a line part LP that are integrally united with each other. The via part VP may be disposed below the line part LP. A barrier/seed pattern SL may be interposed between the first redistribution pattern 342 and the first redistribution dielectric layer IL1, between the second redistribution pattern 344 and the second redistribution dielectric layer IL2, and between the third redistribution pattern 346 and the third redistribution dielectric layer IL3. The barrier/seed pattern SL may include a barrier layer and a seed layer that are sequentially stacked. The barrier layer may include a metal nitride layer. The seed layer may include the same metal as that of the first, second, and third redistribution patterns 342, 344, and 346.

A first redistribution bump 340 may be disposed in the first redistribution dielectric layer IL1. A first redistribution pad 348 may be disposed in the fourth redistribution dielectric layer IL4. An external connection terminal 300 may be bonded to the first redistribution bump 340. The first mold layer MD1 may cover a sidewall of the first semiconductor device DE1 and a top surface of the first redistribution substrate RD1. A first mold via MV1 may penetrate the first mold layer MD1 and may contact the first redistribution pad 348 of the first redistribution substrate RD1. The first mold via MV1 may include a metal, such as copper. The first mold via MV1 may electrically connect the wiring structure 602 to the first redistribution substrate RD1.

The wiring structure 602 may have a similar structure as that of the first redistribution substrate RD1. In an embodiment, the wiring structure 602 may be called a second redistribution substrate. The wiring structure 602 may include fifth, sixth, and seventh interlayer dielectric layers IL5, IL6, and IL7 (referred to hereinafter as fifth, sixth, and seventh redistribution dielectric layers) that are sequentially stacked, and may also include fourth and fifth redistribution patterns 352 and 354 interposed between the fifth, sixth, and seventh redistribution dielectric layers IL5, IL6, and IL7. A sixth redistribution pattern 356 may be disposed on the seventh redistribution dielectric layer IL7. Likewise, the first, second, and third redistribution patterns 342, 344, and 346, each of the fourth, fifth, sixth redistribution patterns 352, 354, and 356 may also include a via part VP and a line part LP. The via parts VP of the first, second, third, fourth, fifth, and sixth redistribution patterns 342, 344, 352, 354, and 356 may have their inclined sidewalls.

A barrier/seed pattern SL may be interposed between the fourth redistribution pattern 352 and the fifth redistribution dielectric layer IL5, between the fifth redistribution pattern 354 and the sixth redistribution dielectric layer IL6, and between the sixth redistribution pattern 356 and the seventh redistribution dielectric layer IL7. A second redistribution bump 350 may be disposed in the fifth redistribution dielectric layer IL5. The first mold via MV1 may connect the second redistribution bump 350 to the first redistribution pad 348.

The semiconductor package 2001, according to an embodiment, might not include the first thermal interface material layer 550. Other structural features may be identical or similar to those discussed above with reference to FIG. 13.

Figure 14B:
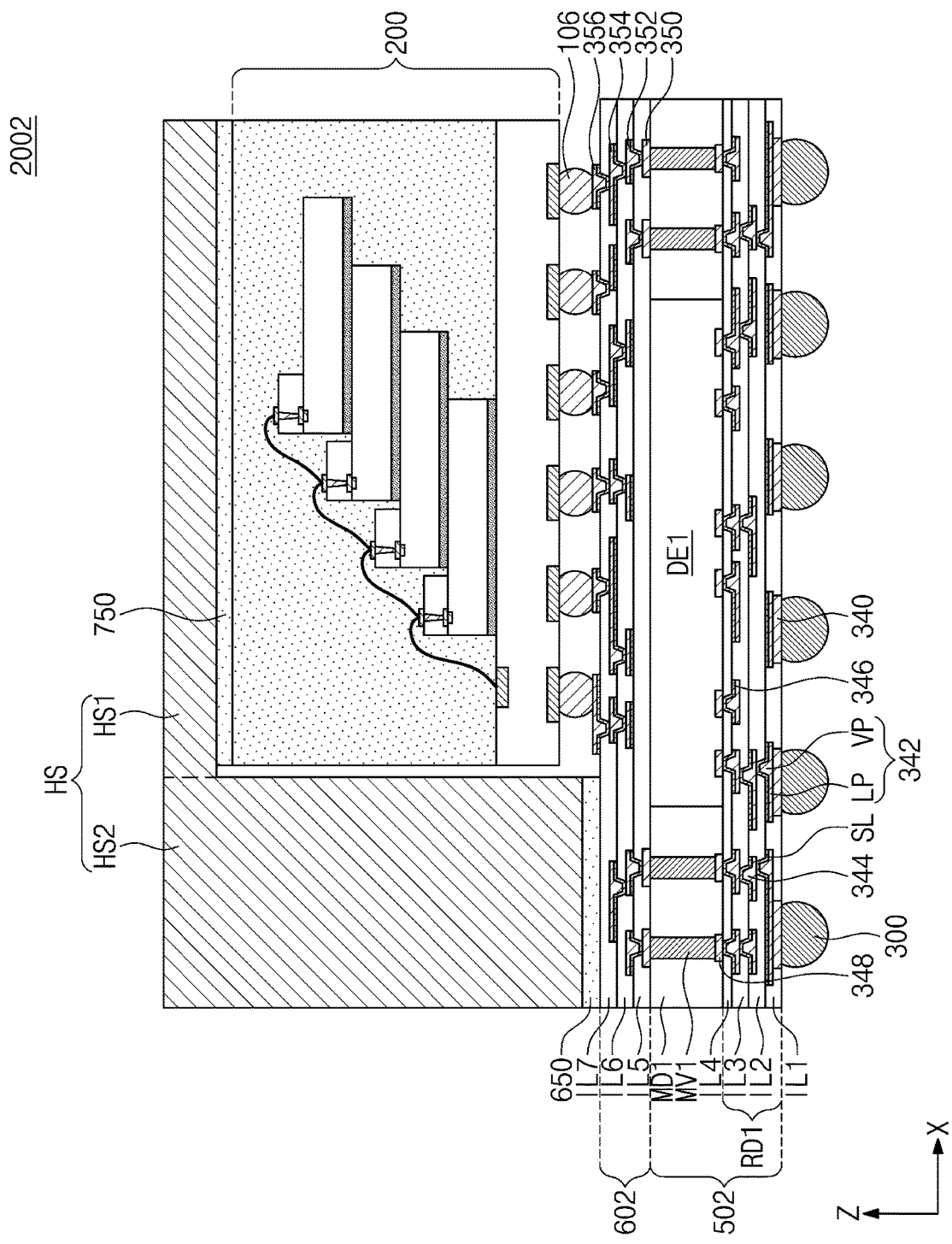
FIG. 14B is a cross-sectional view showing a semiconductor package according to some embodiments of the present inventive concepts.

FIG. 14B is a cross-sectional view showing a semiconductor package according to some embodiments of the present inventive concepts.

Referring to FIG. 14B, a semiconductor package 2002, according to an embodiment, may include a first sub-semiconductor package 502, a wiring structure 602, a second sub-semiconductor package 200, and a thermal radiation member HS that are sequentially stacked. The first sub-semiconductor package 502 may be shaped like a chip first type fan-out wafer level package (FOWLP). The first sub-semiconductor package 502 may include a first redistribution substrate RD1, a first semiconductor device DE1 mounted on the first redistribution substrate RD1, and a first mold layer MD1 that covers the first semiconductor device DE1. The first semiconductor device DE1 may directly contact the first redistribution substrate RD1. The first sub-semiconductor package 502 may exclude the first under-fill layer UF1 and the first internal connection member 310 of FIG. 14A.

Each of first, second, and third redistribution patterns 342, 344, and 346 included in the first redistribution substrate RD1 may include a via part VP and a line part LP that are integrally united with each other. The via part VP may be positioned on the line part LP. A barrier/seed pattern SL may be interposed between the first redistribution pattern 342 and a second redistribution dielectric layer IL2, between the second redistribution pattern 344 and a third redistribution dielectric layer IL3, and between the third redistribution pattern 346 and a fourth redistribution dielectric layer IL4. The first redistribution dielectric layer IL1 may have therein a first redistribution bump 340 in contact with the line part LP of the first redistribution pattern 342. A first redistribution pad 348 may be positioned on the fourth redistribution dielectric layer IL4. Other structural features may be identical or similar to those discussed with reference to FIG. 14A.

FIG. 15 is a cross-sectional view showing a semiconductor package according to some example embodiments of the present inventive concepts.

Referring to FIG. 15, a semiconductor package 2003, according to an embodiment, may include a first sub-semiconductor package 503, a wiring structure 602, a second sub-semiconductor package 200, and a thermal radiation member HS. The first sub-semiconductor package 503 may be shaped like a chip last type fan-out panel level package (FOPLP). The first sub-semiconductor package 503 may include a first redistribution substrate RD1, and may also include a connection substrate 900 and a first semiconductor device DE1 that are mounted on the first redistribution substrate RD1.

The connection substrate 900 may include a cavity region CV at a center thereof. The first semiconductor device DE1 may be disposed in the cavity region CV. The connection substrate 900 may include a plurality of base layers 910 and a conductive structure 920. The base layers 910 may include a dielectric material. For example, the base layers 910 may include a carbon-based material, a ceramic material, or a polymer. The conductive structure 920 may include a connection pad 921, a first connection via 922, a connection line 923, and a second connection via 924. The connection substrate 900 may be connected through a fourth internal connection member 305 to the first redistribution substrate RD1. A second under-fill layer UF2 may be interposed between the connection substrate 900 and the first redistribution substrate RD1. The first mold layer MD1 may fill a space between the first semiconductor device DE1 and an inner sidewall of the cavity region CV in the connection substrate 900. The second connection via 924 of the first sub-semiconductor package 503 may directly contact a second redistribution bump 350 of the wiring structure 602. Other configurations may be identical or similar to those discussed above with reference to FIG. 14A.

Figure 16:
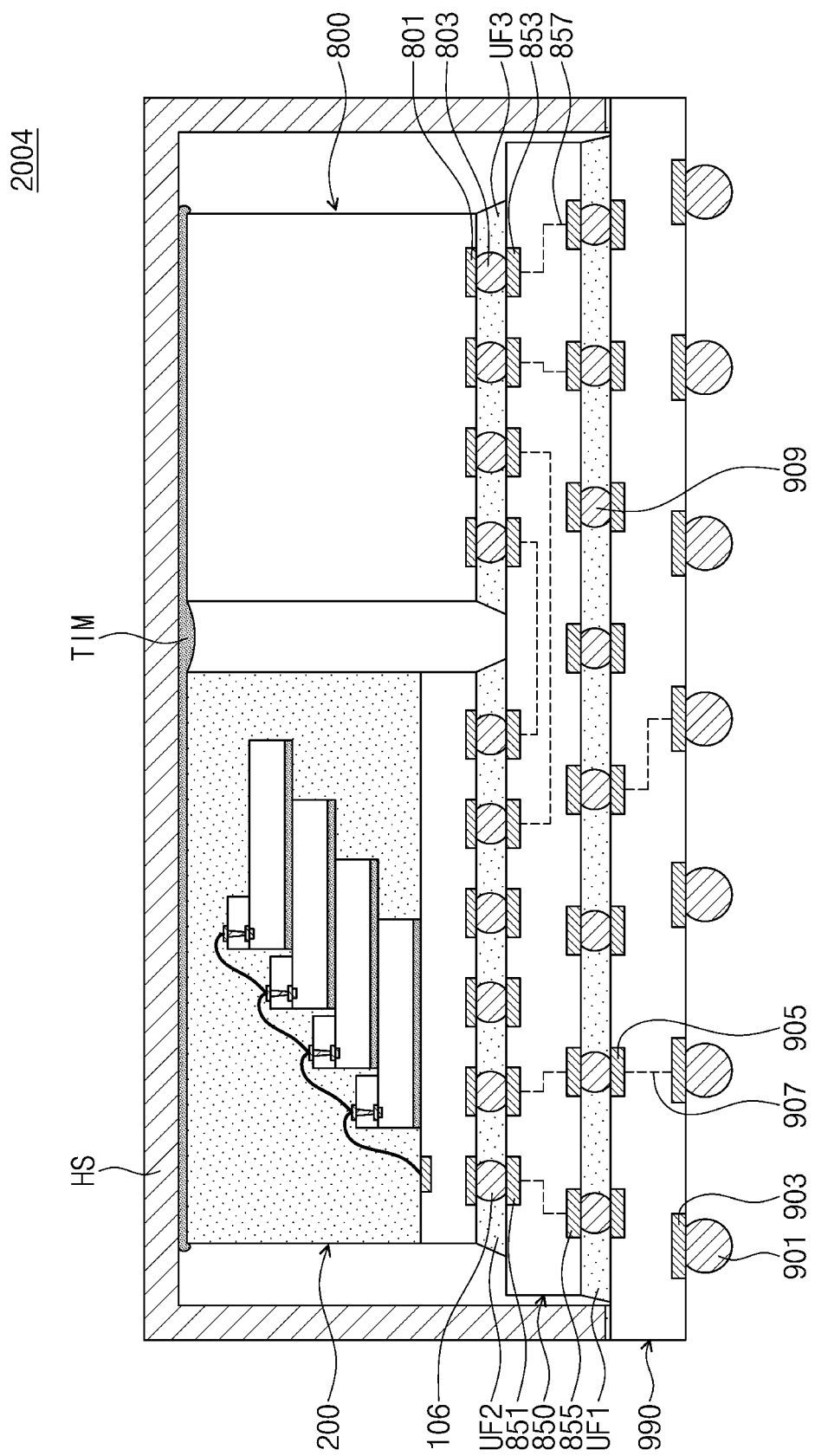
FIG. 16 is a cross-sectional view showing a semiconductor package according to some embodiments of the present inventive concepts.

FIG. 16 is a cross-sectional view showing a semiconductor package according to some embodiments of the present inventive concepts.

Referring to FIG. 16, a semiconductor package 2004, according to an embodiment, may include a package substrate 990, an interposer substrate 850 disposed on the package substrate 990, a sub-semiconductor package 200 and a semiconductor device 800 that are laterally mounted on the interposer substrate 850, and a thermal radiation member that covers the sub-semiconductor package 200 and the semiconductor device 800. The sub-semiconductor package 200 may be the same as or similar to that discussed with reference to FIG. 2. The semiconductor device 800 may be a central processing unit (CPU) that drives the sub-semiconductor package 200. The package substrate 990 and the interposer substrate 850 may each be a printed circuit board.

The package substrate 990 may include first upper conductive patterns 905, first lower conductive patterns 903, and first internal lines 907 that connect the first upper conductive patterns 905 to the first lower conductive patterns 903. External connection terminals 901 may be bonded to the first lower conductive patterns 903. The interposer substrate 850 may be bonded through first internal connection terminals 909 to the first upper conductive patterns 905 of the package substrate 990. A first under-fill layer UF1 may be interposed between the interposer substrate 850 and the package substrate 990.

The interposer substrate 850 may include second upper conductive patterns 851, third upper conductive patterns 853, second lower conductive patterns 855, and second internal lines 857. The sub-semiconductor package 200 may be bonded to the second upper conductive patterns 851. A second under-fill layer UF2 may be interposed between the sub-semiconductor package 200 and the interposer substrate 850. The semiconductor device 800 may include chip terminals 801. Second internal connection terminals 803 may connect the chip terminals 801 to the third upper conductive patterns 853. A third under-fill layer UF3 may be interposed between the semiconductor device 800 and the interposer substrate 850. The sub-semiconductor package 200 may be connected to the semiconductor device 800 through ones of the second internal lines 857. A thermal interface material layers TIM may be interposed between the thermal radiation member HS and the sub-semiconductor package 200 and between the thermal radiation member HS and the semiconductor device 800. Other structural features may be identical or similar to those discussed above.

In the present inventive concepts, a single semiconductor chip may be divided based on function to form a first sub-chip and a second sub-chip having different sizes from each other, and the first and second sub-chips may be stacked to constitute a stacked first semiconductor structure, with the result that a semiconductor chip may decrease in horizontal size.

Furthermore, a stepped semiconductor structure may be fabricated by stacking a relatively large-sized second sub-chip on a relatively small-sized first sub-chip, and a plurality of the stepped semiconductor chips may be sacked offset from each other, with the result that a semiconductor package may decrease in overall thickness. As a result, the semiconductor package may achieve its high integration.

Although the present inventive concepts have been described in connection with some embodiments of the present inventive concepts illustrated in the accompanying drawings, it will be understood to those skilled in the art that various changes and modifications may be made without departing from the technical spirit and teachings of the present disclosure. It will be apparent to those skilled in the art that various substitution, modifications, and changes may be thereto without departing from the scope and spirit of the present disclosure. It is to be understood that the various elements and structured depicted in FIGS. 1 to 16 and described with reference thereto may be combined with each other in any conceivable manner.

What is claimed is:

1. A semiconductor package, comprising:
a plurality of first semiconductor structures stacked on a package substrate, wherein the first semiconductor structures of the plurality of first semiconductor structures are offset from each other in a first direction; and
a plurality of first adhesive layers disposed between pairs of first semiconductor structures of the plurality of first semiconductor structures,
wherein each of the plurality of first semiconductor structures includes a first sub-chip and a second sub-chip in contact with a part of a top surface of the first sub-chip,
wherein each of the plurality of first adhesive layers contacts the first sub-chip, and each of the plurality of first adhesive layers is spaced apart from the second sub-chip,
wherein a thickness of each of the plurality of first adhesive layers is less than a thickness of the second sub-chip, and
wherein the thickness of the second sub-chip is in a range of about 13 µm to about 20 µm.

2. The semiconductor package of claim 1, wherein
the first sub-chip has a first width in the first direction,
the second sub-chip has a second width in the first direction, and
the second width is about ½₀ to about ¼ of the first width.

3. The semiconductor package of claim 1, wherein the plurality of first semiconductor structures includes at least a first-first semiconductor structure and a second-first semiconductor structure that immediately overlies the first-first semiconductor structure, and wherein a top surface of the second sub-chip included in the first-first semiconductor structure is lower than a top surface of the first sub-chip included in the second-first semiconductor structure.

4. The semiconductor package of claim 1, wherein
the first sub-chip of each of the plurality of first semiconductor structures includes a first connection pad in contact with the second sub-chip of each of the plurality of first semiconductor structures,
the second sub-chip of each of the plurality of first semiconductor structures includes a second connection pad in contact with the first connection pad,
a bottom surface of the first connection pad is downwardly convex, and
a top surface of the second connection pad is upwardly convex.

5. The semiconductor package of claim 4, wherein the second sub-chip of each of the plurality of first semiconductor structures includes:
a second substrate;
a second interlayer dielectric layer disposed below the second substrate;
a through via that penetrates the second substrate and a portion of the second interlayer dielectric layer and is electrically connected with the second connection pad; and
a bonding pad in contact with the through via and on the second substrate,
wherein the semiconductor package further comprises a wire that connects the bonding pad of the second sub-chip of each of the plurality of first semiconductor structures.

6. The semiconductor package of claim 1, further comprising:
a plurality of second semiconductor structures stacked on an uppermost one of the plurality of first semiconductor structures and is offset from the plurality of first semiconductor structures in a second direction opposite to the first direction; and
a plurality of second adhesive layers disposed between pairs of second semiconductor structures of the plurality of second semiconductor structures,
wherein each of the plurality of second semiconductor structures includes a third sub-chip and a fourth sub-chip partially overlapping a top surface of the third sub-chip, wherein for each pair of second semiconductor structures of the plurality of second semiconductor structures, there is a top semiconductor structure and a bottom semiconductor structure with a respective second adhesive layer disposed therebetween and the third sub-chip of the top semiconductor structure and the third sub-chip of the bottom semiconductor structure each contact the respective second adhesive layer and the fourth sub-chip of the top semiconductor structure and the fourth sub-chip of the bottom semiconductor structure are each spaced apart from the respective second adhesive layer, and wherein a thickness of each of the plurality of second adhesive layers is less than a thickness of the fourth sub-chip.

7. The semiconductor package of claim 6, wherein a top surface of the second sub-chip included in an uppermost one of the plurality of first semiconductor structures is lower than a bottom surface of the third sub-chip included in a lowermost one of the plurality of second semiconductor structures.

8. The semiconductor package of claim 7, further comprising a support pattern disposed between the first sub-chip included in the uppermost one of the plurality of first semiconductor chips and the third sub-chip included in the lowermost one of the plurality of second semiconductor chips.

9. The semiconductor package of claim 8, further comprising a mold layer that covers the plurality of first semiconductor structures and the plurality of second semiconductor structures, wherein the mold layer is disposed between the support pattern and the second sub-chip included in the uppermost one of the plurality of first semiconductor structures.

10. The semiconductor package of claim 1, wherein the second sub-chip has an "I" or "L" shape.

11. A semiconductor package, comprising:
a plurality of first semiconductor structures stacked on a package substrate, wherein the first semiconductor structures of the plurality of first semiconductor structures are offset from each other in a first direction; and
a plurality of first adhesive layers disposed between pairs of first semiconductor structures of the plurality of first semiconductor structures,
wherein each of the plurality of first semiconductor structures includes a first memory chip and a first peripheral circuit chip in contact with a part of a top surface of the first memory chip,
wherein each of the plurality of first adhesive layers contacts the first memory chip, and each of the plurality of first adhesive layers is spaced apart from the first peripheral circuit chip,
wherein the first memory chip includes:
a first semiconductor substrate that includes a cell array region and a connection region;
a plurality of electrode layers and a plurality of inter-electrode dielectric layers that are alternately stacked on the first semiconductor substrate and form a stepwise shape on the connection region;
a plurality of vertical patterns disposed on the cell array region, the vertical patterns penetrating the plurality electrode layers and the plurality of inter-electrode dielectric layers;

a planarized dielectric layer covering ends of each of the plurality of electrode layers and ends of each of the plurality of inter-electrode dielectric layers on the connection region; and
a plurality of cell contacts penetrating the planarized dielectric layer and the plurality of inter-electrode dielectric layers to come into contact with corresponding electrode layers, of the plurality of electrode layers, on the connection region,
wherein the first peripheral circuit chip overlaps the plurality of cell contacts and does not overlap at least one of the plurality of vertical patterns.

12. The semiconductor package of claim 11, wherein the first memory chip further includes a first connection pad connected to the plurality of cell contacts and in contact with the first peripheral circuit chip,
wherein the first peripheral circuit chip includes a second connection pad in contact with the first connection pad, and
wherein a width of the second connection pad is greater than a width of the first connection pad.

13. The semiconductor package of claim 11, wherein
the first memory chip has a first width in the first direction,
the first peripheral circuit chip has a second width in the first direction, and
the second width is about 1/20 to about 1/4 of the first width.

14. The semiconductor package of claim 11, wherein the first peripheral circuit chip has an "I" or "L" shape.

15. A semiconductor package, comprising:
a first semiconductor structure and a second semiconductor structure that are sequentially stacked on a package substrate, the second semiconductor structure exposing a portion of the first semiconductor structure,
wherein the first semiconductor structure includes a first memory chip and a first peripheral circuit chip in contact with a portion of a top surface of the first memory chip, the first peripheral circuit chip being electrically connected to the first memory chip,
wherein the second semiconductor structure includes a second memory chip and a second peripheral circuit chip in contact with a portion of a top surface of the second memory chip, the second peripheral circuit chip being electrically connected to the second memory chip, and
wherein the second memory chip overlaps the first memory chip and does not overlap the first peripheral circuit chip.

16. The semiconductor package of claim 15, wherein the second semiconductor structure has either a shape that is the same as a shape of the first semiconductor structure or a shape obtained by rotating the first semiconductor structure by about 90° or about 180°.

17. The semiconductor package of claim 15, wherein a top surface of the first peripheral circuit chip is lower than a top surface of the second memory chip and higher than a bottom surface of the second memory chip.

18. The semiconductor package of claim 15, further comprising an adhesive layer disposed between the first semiconductor structure and the second semiconductor structure,
wherein a thickness of the adhesive layer is less than a thickness of the first peripheral circuit chip.

19. The semiconductor package of claim 15, wherein the first memory chip further includes a first connection pad connected to a cell contact penetrating a planarization dielectric layer, the first connection pad being in contact with the first peripheral circuit chip, wherein the first peripheral circuit chip includes a second connection pad in contact with the first connection pad, and wherein a width of the second connection pad is greater than a width of the first connection pad.

20. The semiconductor package of claim 15, wherein the first peripheral circuit chip has an "I" or "L" shape.

\* \* \* \* \*